United States Patent
Nakabayashi et al.

(10) Patent No.: US 7,501,156 B2
(45) Date of Patent: *Mar. 10, 2009

(54) PATTERN FORMATION SUBSTRATE AND METHOD FOR PATTERN FORMATION

(75) Inventors: Takaya Nakabayashi, Ayama-gun (JP); Akiyoshi Fujii, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 710 days.

This patent is subject to a terminal disclaimer.

(21) Appl. No.: 10/525,901

(22) PCT Filed: Jun. 5, 2003

(86) PCT No.: PCT/JP03/07170

§ 371 (c)(1),
(2), (4) Date: Feb. 25, 2005

(87) PCT Pub. No.: WO2004/023541

PCT Pub. Date: Mar. 18, 2004

(65) Prior Publication Data

US 2005/0242394 A1   Nov. 3, 2005

(30) Foreign Application Priority Data

Aug. 30, 2002   (JP)   ............... 2002-255646

(51) Int. Cl.
- *B05D 5/00* (2006.01)
- *G03F 1/00* (2006.01)
- *B41J 2/01* (2006.01)
- *H01L 21/44* (2006.01)

(52) U.S. Cl. ............... 427/256; 257/E21.582; 347/107; 430/5; 438/676

(58) Field of Classification Search ............ 427/256
See application file for complete search history.

(56) References Cited

U.S. PATENT DOCUMENTS

| 5,820,029 | A * | 10/1998 | Marans ................. 239/542 |
| 6,696,225 | B1 | 2/2004 | Kanbe et al. |
| 6,734,029 | B2 * | 5/2004 | Furusawa ................. 438/22 |
| 7,119,026 | B2 * | 10/2006 | Honda et al. ............ 438/748 |
| 7,198,816 | B2 * | 4/2007 | Masuda et al. ......... 427/97.3 |
| 2002/0151161 | A1 | 10/2002 | Furuzawa |
| 2003/0059686 | A1 | 3/2003 | Kobayashi et al. |

FOREIGN PATENT DOCUMENTS

| EP | 0 930 641 A2 | 7/1999 |
| JP | 63-200041 | 8/1988 |
| JP | 11-274671 | 10/1999 |
| JP | 2000-3369 B | 2/2000 |

(Continued)

*Primary Examiner*—Michael Kornakov
*Assistant Examiner*—Alexander Weddle
(74) *Attorney, Agent, or Firm*—George W. Neuner; David G. Conlin; Edwards Angell Palmer & Dodge LLP

(57) ABSTRACT

A pattern formation substrate comprising a substrate having thereon a hydrophobic region exhibiting repellency to liquid drops and a hydrophilic line exhibiting affinity with liquid drops. The hydrophilic line has such a surface treatment that upon landing of a liquid drop thereon, the liquid drop moves in the arrowed direction. Thus, attachment of liquid drops to regions to which liquid drops should not be adhered can be prevented, thereby enabling forming a pattern of desired characteristics.

9 Claims, 18 Drawing Sheets

FOREIGN PATENT DOCUMENTS

| | | | |
|---|---|---|---|
| JP | 2002-164635 | | 6/2002 |
| JP | 2002164635 A | * | 6/2002 |
| WO | 01/46987 | | 6/2001 |
| WO | 01/47045 | | 6/2001 |
| WO | WO 2004/021447 A1 | | 3/2004 |
| WO | WO 2004/023540 A1 | | 3/2004 |
| WO | WO/2004/023561 A1 | | 3/2004 |

* cited by examiner

PATTERN FORMATION SUBSTRATE AND METHOD FOR PATTERN FORMATION

CROSS-REFERENCE TO RELATED APPLICATIONS

This is a 371 application of PCT/JP03/07170 filed Jun. 5, 2003.

1. Technical Field

This invention is related to a pattern formation substrate and a pattern formation method in which a predetermined pattern is formed by ejecting droplets to a surface of an object.

2. Background Art

Inkjet technology has been utilized, in recent years, for forming a wiring pattern of a circuit board. The inkjet technology allows the wiring pattern to be directly formed on a substrate. Therefore, unlike a conventional printing technology involving a lithography process, the inkjet technology eliminates costly processes such as a vacuum film formation→a photolithography→a resist peeling This enables a production of a circuit board at a low cost.

Incidentally, as to forming the wiring pattern by using the inkjet technology, fluid ink (droplets) containing a wiring material is so ejected as to land on a predetermined position on the substrate, thereby forming the wiring pattern. When the droplets land on the substrate, the droplets may be excessively dispersed or split, due to the characteristics of a surface of the substrate. This causes difficulties in a formation of a desirable wiring pattern.

Japanese Unexamined Patent Publication No. 11-204529/1999 (Tokukaihei 11-204529; published on Jul. 30, 1999) discloses a method for forming a desirable wiring patterns, by preventing, to the greatest possible extent, the droplets landed from being excessively dispersed or being split.

According to the technology disclosed in the foregoing Tokukaihei, the surface of a substrate is modified in advance so that a region subjected to the formation of the wiring pattern has affinity with the droplet and other regions have droplet-repellency. The wiring pattern is formed by the ejected droplets landed on the region having the affinity with the droplet (pattern-formation region) on the substrate. In this case, the regions other than the pattern-formation region have the droplet-repellency. This prevents the droplets landed on the pattern-formation region from dispersing beyond the region subjected to the pattern formation.

Moreover, in the technology disclosed in the foregoing Tokukaihei, the droplets are landed partially overlapping another droplet so that the landed droplets are not split. This prevents the droplets landed on the substrate from being split.

Incidentally, in the inkjet method, the droplets may be scattered on the substrate. This may cause the droplets to adhere to regions other than positions where the droplets are supposed to land. In the case where the method disclosed in the foregoing Tokukaihei is adopted, the droplets need to be dropped on the entire region of the pattern to be formed. Accordingly, it is necessary to drop the droplets also in the vicinity of regions where no droplets are allowed to be scattered (hereinafter referred to as droplet-free region). This may cause the droplets to adhere to the droplet-free region. For example, in a case of forming source and drain electrodes of a TFT (Thin Film Transistor), adhesion of the droplets on a channel section will cause a problem that a desirable performance of the TFT is not obtained. In short, the yield of the TFT is deteriorated.

Accordingly, the method disclosed in the foregoing Tokukaihei may fail to form the wiring pattern having desirable characteristics, and may cause the deterioration in the yield of the wiring pattern.

In view of the foregoing problems, the present invention was made, and an object of the present invention is to provide a pattern formation substrate and a pattern formation method, for forming the wiring pattern with the desirable characteristics, by preventing the droplets from adhering to the droplet-free regions.

DISCLOSURE OF INVENTION

A pattern formation substrate of the present invention, on which a predetermined pattern is formed by ejecting a droplet to a targeted surface, includes: (A) a first region where a contact angle at which the droplet contacts the targeted surface is a first contact angle, said first region being formed on the targeted surface; and (B) one or more second regions where the contact angle of the droplet is a second contact angle smaller than the first contact angle, said second region being formed on the targeted surface so as to be positioned adjacent to the first region, in which a surface of the second region is treated so that the droplet moves in a predetermined direction when the droplet is landed.

Since the landed droplet on the second region moves towards a predetermined direction, it is possible to target the landing position of the droplet farther than a conventional landing position. Here, the conventional landing position means a position in which the landed droplet can move in all of the directions in the second region. This is advantageous in a case where there is a region on which the droplet should not be adhered (droplet-free region), in the vicinity of the conventional landing position. This is because the landing position of the droplet can be targeted far from the droplet-free region. Thus, the droplet is kept from adhering to the droplet-free region.

Accordingly, this solves any problems caused by the adhesion of the droplet to the droplet-free region, such as a case where desirable properties of the wiring pattern (TFT) is not obtained. In short, this improves the yield of wiring pattern with desirable properties.

Further, the pattern formation substrate of the present invention may be so adapted that a first line width $L_1$ and a second line width $L_2$ are so adjusted as to satisfy an equation (1) below, $$L_1 > D/\{1+2(\cos\theta_2 - \cos\theta_1)\}$$

and $$L_2 > D/\{1+2(\cos\theta_2 - \cos\theta_1)\} \qquad (1),$$

where:

the first line width $L_1$ is a width on a side, in the second region, toward which the droplet moves upon landing, the second line width $L_2$ is a width on a side, in the second region, opposite to the side toward which the droplet moves, $\theta_1$ is the first contact angle of the droplet in the first region, $\theta_2$ is the second contact angle of the droplet in the second region, and D is a diameter of the droplet.

By setting the first line width and the second line width so as to satisfy the equation (1), the landed droplet moves in the predetermined direction; i.e. from the side of the second line width to the side of the first line width, in the second region.

As described, by regulating the line widths of the droplet landing position so that the equation (1) is satisfied, it is possible to successfully form the wiring, despite the droplet landing position being adjusted apart from the droplet-free region.

Thus, since the droplets do not adhere to the droplet-free region, deterioration in the properties of the wiring pattern being formed is prevented. This improves the yield of the wiring pattern.

Further, the pattern formation substrate of the present invention may be so adapted that (A) each of the contact angles is so adjusted as to satisfy an equation (2) below, $$L\times\{1+2(\cos\theta_3-\cos\theta_1)\}<D<L\times\{1+2(\cos\theta_2-\cos\theta_1)\} \quad (2),$$

where:

$\theta_1$ is the first contact angle of the first region with respect to the droplet, $\theta_2$ is the second contact angle of the second region with respect to one side of the droplet landed, $\theta_3$ is a third contact angle of the second region with respect to another side of the droplet, a line width L is a width of the second region, and D is a diameter of the droplet; and (B) a position of the droplet being landed is targeted so as to overlap the first region and two of the second regions.

In this case, since the contact angles in the respective regions are so adjusted as to satisfy the equation (2), it is possible to cause the droplet landed, overlapping the three regions, to move in a predetermined direction, without changing the line widths of the second regions. For example, in a case where the second contact angle $\theta_2$ is smaller than the third contact angle $\theta_3$, in the second regions, the landed droplet is more likely to move toward one of the second regions where the contact angle is the second contact angle $\theta_2$ than the other second region where the contact angle is the third contact angle $\theta_3$. Here, in a case where the third contact angle $\theta_3$ equals to the first contact angle $\theta_1$ in the first region, the droplet is repelled by one of the second regions where the contact angle is the third contact angle $\theta_3$. This causes the droplet to move only toward one of the second region where the contact angle is the second contact angle $\theta_2$.

By regulating the line widths of the droplet landing position so that the equation (2) is satisfied, it is possible to successfully form the wiring, despite the droplet landing position being targeted far from the droplet-free region.

Thus, since the droplets do not adhere to the droplet-free region, deterioration in the properties of the wiring pattern being formed is prevented. This improves the yield of the wiring pattern.

A method of the present invention for forming pattern includes the step of forming a predetermined pattern by ejecting a droplet to the pattern formation substrate.

Since it is possible to control the direction toward which the droplet landed on the pattern formation substrate moves, the droplet landing position can be targeted at the position far from the droplet-free region.

Accordingly, this solves any problems caused by the adhesion of the droplet to the droplet-free region, such as deterioration in the yield of the wiring pattern.

Further, the method of the present invention for forming a pattern may be so adapted that a continuous pattern is formed by connecting a plurality of droplets adhering to a targeted surface in a scattering-manner.

In this case, a number of droplets ejected is minimized, thereby enabling a reduction of the tact time and more durable droplet ejection structure.

Further, the method of the present invention for forming a pattern may be so adapted that an inkjet head is used for ejecting the droplet.

In this case, it is possible to use a general-purpose inkjet head, for use in a printer or the like, as a droplet ejection mechanism. This allows an apparatus for forming a pattern to be produced at a low cost.

Further, the method of the present invention for forming a pattern may be so adapted that the first and the second regions are formed substantially flat shape.

Here, "substantially flat" means that a difference in levels of the first and the second regions is extremely small when compared to the thickness of the pattern to be formed. Accordingly, it is no longer necessary to form banks for clarifying a difference in the affinity with water between the first and the second regions. As a result, it is possible to reduce a number of processes for forming the pattern.

Further, the method of the present invention for forming a pattern may be so adapted that the droplet contains an electrically conductive particle.

In this case, since a wiring pattern is a pattern formed by the ejected droplet, it is possible to form the wiring pattern with a constant line width and line thickness.

Additional objects, features, and strengths of the present invention will be made clear by the description below. Further, the advantages of the present invention will be evident from the following explanation in reference to the drawings.

BRIEF DESCRIPTION OF DRAWINGS

FIG. 1($b$) is a plane view illustrating the droplet immediately after landing on a pattern formation substrate.

FIG. 2($b$) is a diagram illustrating affinity with a droplet.

FIG. 5($a$) is a plane view and FIG. 5($b$) is a cross sectional view taken along the line A-A' in FIG. 5($a$).

FIG. 6($a$) is the plane view and FIG. 6($b$) is a cross sectional view taken along the line A-A' in FIG. 6($a$).

FIG. 7($a$) is the plane view and FIG. 7($b$) is a cross sectional view taken along the line A-A' in FIG. 7($a$).

FIG. 8($a$) is the plane view and FIG. 8($b$) is a cross sectional view taken along the line A-A' in FIG. 8($a$).

FIG. 9($a$) is the plane view and FIG. 9($b$) is a cross sectional view taken along the line A-A' in FIG. 9($a$).

FIG. 10($a$) is the plane view and FIG. 10($b$) is a cross sectional view taken along the line A-A' in FIG. 10($a$).

FIG. 15(a) is the plane view and FIG. 15(b) is a cross sectional view taken along the line B-B' in FIG. 15(a).

FIG. 16(a) is the plane view and FIG. 16(b) is a cross sectional view taken along the line B-B' in FIG. 16(a).

FIG. 17(a) is the plane view and FIG. 17(b) is a cross sectional view taken along the line B-B' in FIG. 17(a).

FIG. 18(a) is the plane view and FIG. 18(b) is a cross sectional view taken along the line B-B' in FIG. 18(a).

FIG. 19(a) is the plane view and FIG. 19(b) is a cross sectional view taken along the line B-B' in FIG. 19(a).

BEST MODE FOR CARRYING OUT THE INVENTION

Embodiment 1

The following describes an embodiment 1 of the present invention. It should be noted that the present embodiment describes a pattern formation method, for forming source and drain wiring of a TFT (Thin Film Transistor), in a production process of a liquid crystal panel.

First described is a pattern formation apparatus for implementing the pattern formation method of the present invention.

Figure 3:
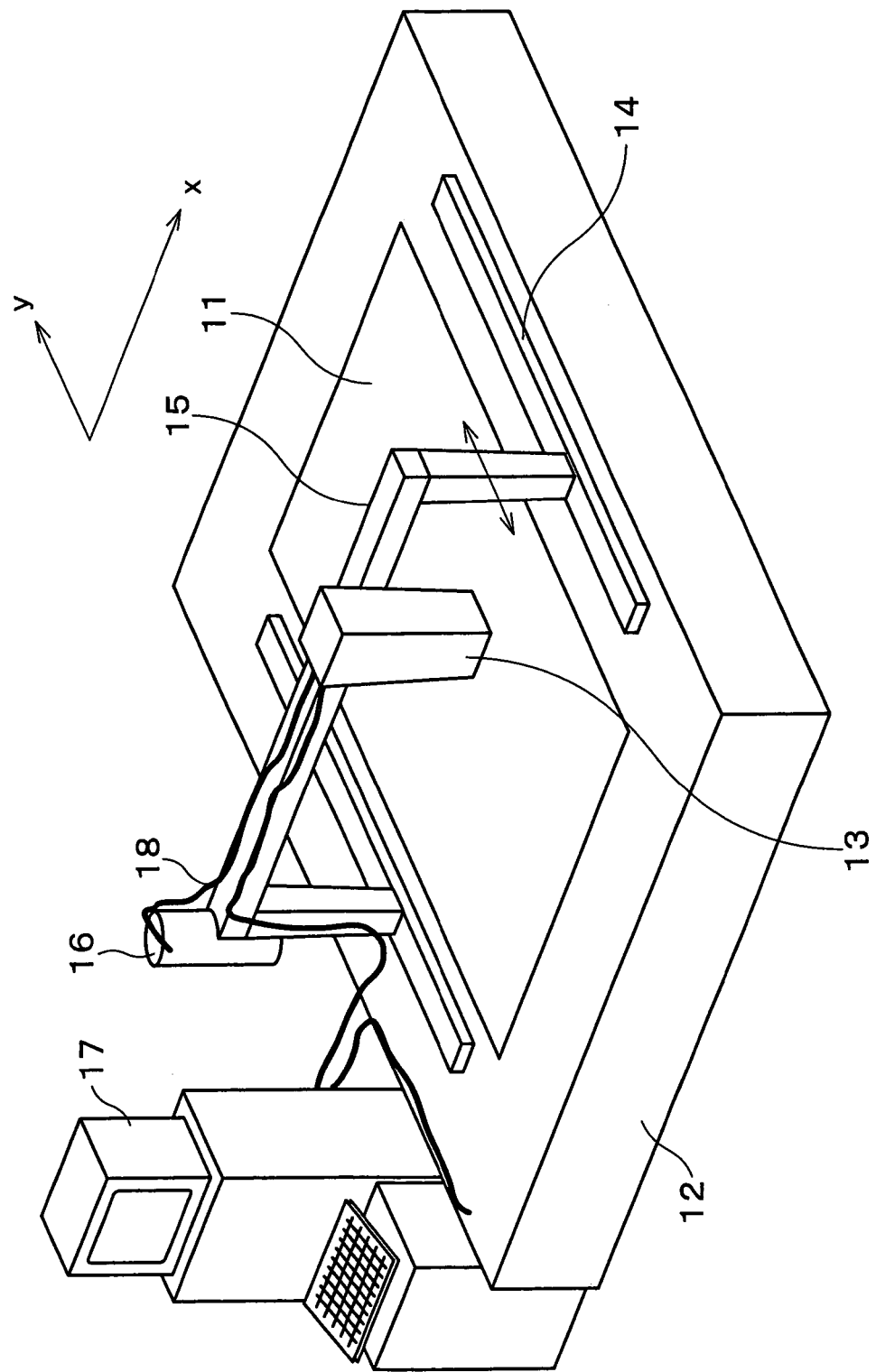
FIG. 3 is a schematic perspective view illustrating a pattern formation apparatus to which a pattern formation method of the present invention is adopted.

As shown in FIG. 3, the pattern formation apparatus of the present embodiment includes a stage 12 for placing thereon a substrate (pattern formation substrate) 11 having a surface subjected to a pattern formation. The stage 12 includes (I) an inkjet head 13 (droplet ejection means) for ejecting fluid ink (droplets) containing a wiring material to the substrate 11, (II) a y-direction driving section 14 for sliding the inkjet head 13 in a y-direction, and (III) an x-direction drive section 15 for sliding the inkjet head 13 in an x-directional.

Moreover, the pattern formation apparatus is provided with (a) a droplet supplying system 16 and a liquid supplying conduit 18, for supplying the droplets to the inkjet head 13, and (b) an apparatus controlling unit 17 for controlling various kinds of operations such as: ejection of the droplets from the inkjet head 13; and driving operations of the y-direction drive section 14 and the x-direction drive section 15.

The liquid supplying conduit 18 is provided between the inkjet head 13 and the droplet supplying system 16. The droplet supplying system 16 controls the droplet supply to the inkjet head 13.

A signal cable (not shown) is provided between (a) the apparatus control unit 17 and (b) the inkjet head 13, the y-direction drive section 14, and the x-direction drive section 15. The apparatus control unit 17 controls ejection of the droplets from the inkjet head 13, and controls driving operations of the y-direction drive section 14 and the x-direction drive section 15.

Thus, the apparatus control unit 17 gives (i) wiring pattern information (Positional information for application) of the substrate 11 to the y-direction drive section 14 and the x-direction drive section 15 and (ii) ejection information to a driver (not shown) of the inkjet head 13 in a synchronous manner. This enables the droplets to be dropped on any positions of the entire substrate 11.

The inkjet head 13 may be a piezo-electric type inkjet head adopting a piezo-electric element whose shape changes with an application of voltage. In the piezo-electric type inkjet head, the droplets are ejected from a nozzle by instantaneously raising a liquid pressure in an ink chamber with the application of voltage to the piezo-electric element. The inkjet head 13 may also be a thermal type inkjet head having a heater. The thermal type inkjet head ejects the droplets by creating bubbles within liquid by using the heater. In both cases, a diameter of an ejected droplet can be controlled by voltage applied to the piezo electric element or the heater.

In the present embodiment, the pattern formation apparatus adopts a piezo-electric actuation type inkjet head having plurality of nozzles with 55 μm in respective diameters, and an actuating voltage waveform is varied so that the diameter of the ejected droplet is varied within a range of 50 to 75 μm.

As shown in FIGS. 1(a) and 1(b), a hydrophilic line (a second region) 6 exhibiting affinity with water and hydrophobic regions (first regions) 7 exhibiting repellency to water are formed on the surface of the substrate 11, which is subjected to the pattern formation. A method for forming the hydrophilic line 6 and hydrophobic region 7 is described later. FIG. 1(a) is a side view showing a condition under which a droplet 8 has not landed on the substrate 11, and FIG. 1(b) is a plane view showing a condition under which the droplet 8 has just landed on the substrate 11. As described later, the hydrophilic line 6 and hydrophobic region 7 are obtained through a chemical treatment, therefore the hydrophilic line 6 and the hydrophobic region 7 on the substrate 11 are substantially flat. Therefore, a number of processes is reduced compared with a conventional method in which banks are formed before the formation of the wiring pattern.

Here, FIG. 2(a) shows a contact angle (a first contact angle) $\theta_1$ of the droplet with respect to the hydrophobic region 7, and FIG. 2(b) shows a contact angle (a second contact angle) $\theta_2$ of the droplet with respect to the hydrophilic line 6. As shown in these figures, the contact angle of the droplet with respect to the hydrophobic region 7 is larger than the contact angle with respect to the hydrophilic line 6, and the wettability of the hydrophobic region 7 is low. In short, the hydrophobic region 7 is a region which is less affinitive with water. On the contrary, the contact angle of the droplet with respect to the hydrophilic line 6 is smaller than the contact angle with respect to the hydrophobic region 7, and the wettability of the hydrophilic line 6 is high. In short, the hydrophilic line 6 is more affinitive with water.

To clearly describe the characteristics of the hydrophobic region 7 and the hydrophilic line 6, it is preferred that the hydrophobic region 7 be so adjusted that the hydrophobic region exhibits water repellency to reject the droplets, and that the hydrophilic line 6 be so adjusted that the hydrophilic line exhibits affinity with the droplets.

Accordingly, by providing, on the substrate 11, a region exhibiting affinity with water (hydrophilic line 6) and a region exhibiting repellency to the water (hydrophobic region 7), a droplet landed on the hydrophobic region 7 is repelled and attracted to the hydrophilic line 6 adjacent to the hydrophobic region 7. The droplet will be then dispersed along the hydrophilic line 6.

In the present invention, a shape of the hydrophilic line 6 is so designed as to control the dispersing direction of the droplet on the hydrophilic line 6, on the premise that the hydrophilic line 6 and the hydrophobic region 7 are provided on the substrate 11.

Figure 1:
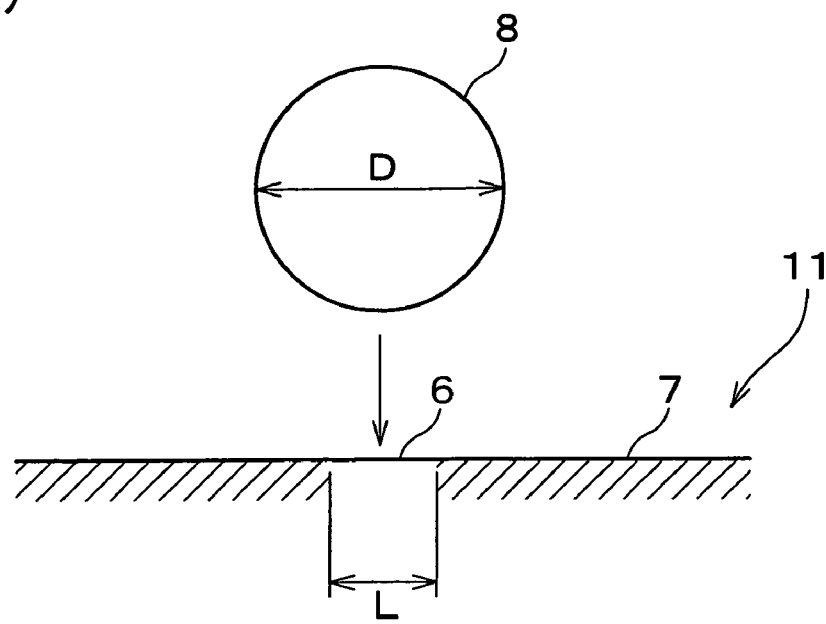
FIG. 1($a$) is a side view illustrating a droplet just before landing on a pattern formation substrate.
Figure 1:
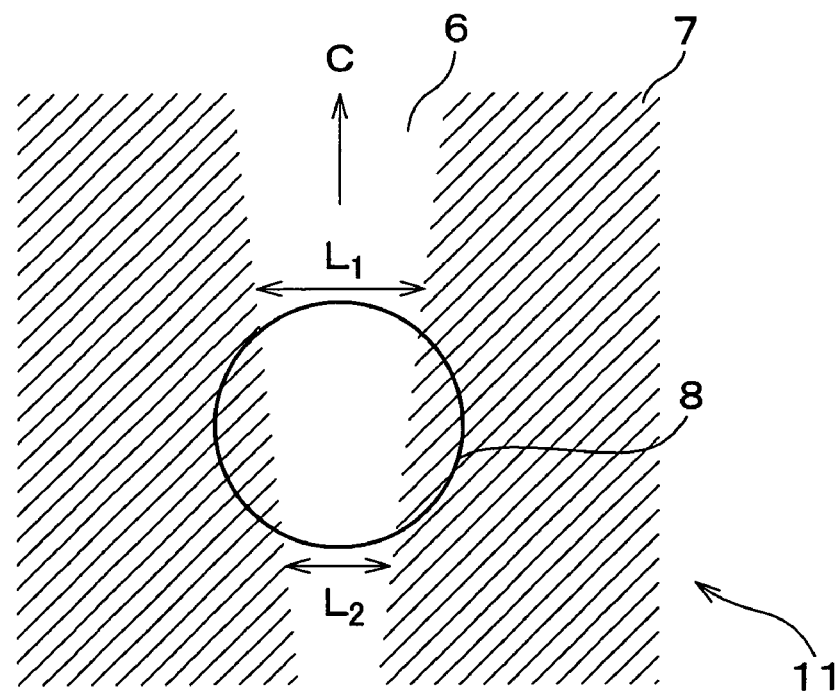

That is to say, as shown in FIG. 1(*b*), in the present embodiment, the hydrophilic line 6 is so adjusted that a line width $L_1$ (a first line width) on a side of the landed droplet 8 (direction of the arrow C in the figure) is wider than a line width $L_2$ (a second line width) on another side of the droplet (counter direction to the arrow C). Here, it is possible to control a direction to which the droplet moves, by adjusting the both of the line widths so that the following equation (1) is satisfied.

$$L_1 > D/\{1+2(\cos\theta_2 - \cos\theta_1)\}$$

$$L_2 < D/\{1+2(\cos\theta_2 - \cos\theta_1)\} \quad (1)$$

where:

D: droplet diameter $\theta_1$: first contact angle $\theta_2$: second contact angle.

The following describes how to derive the foregoing equation (1).

As described above, in case of carrying out the pattern formation by dropping the droplets 8 on the substrate 11 having the hydrophilic line 6 and the hydrophobic region 7, i.e., a hydrophilic-and-hydrophobic pattern, the shape of the landed droplet may either remain the same, or change along the pattern being formed. Since the landed droplet 8 changes its shape to a shape indicative of a lower energy state, a preferable pattern formation is achieved by calculating a change in the energy state, and previously controlling the diameter D of the droplet 8 in accordance with the line width L of the hydrophilic line 6.

Figure 2:
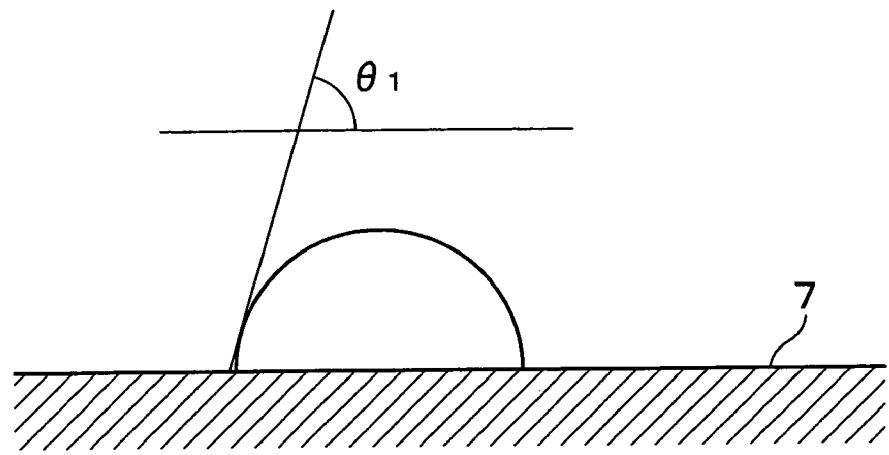
FIG. 2($a$) is a diagram illustrating repellency to a droplet.
Figure 2:
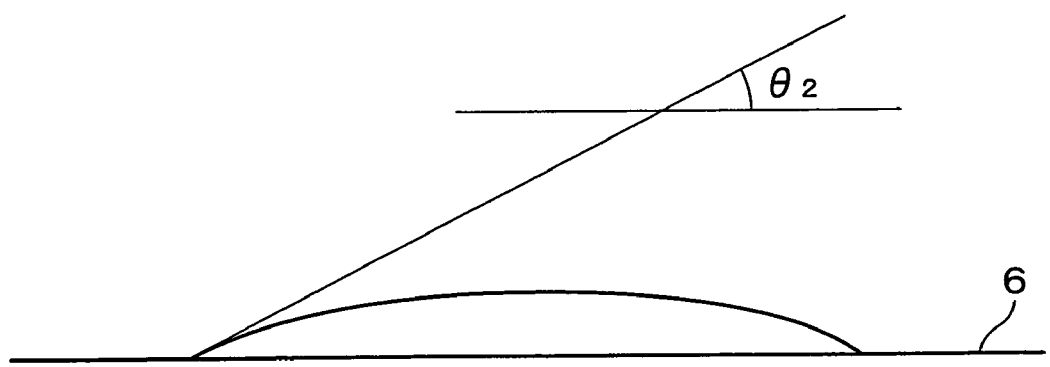

First, as shown in FIG. 1(*a*), it is assumed that (I) the droplet 8 with a diameter of D is dropped on the hydrophilic line 6 sandwiched by the hydrophobic regions 7 on both sides, and (II) the hydrophilic line 6 has a monospaced line width L. It is further assumed that, as shown in FIG. 2(*a*), the contact angle of the droplet 8 landed on the hydrophobic region 7 is $\theta_1$, and a contact angle of the droplet landed on the hydrophilic region 7 is $\theta_2$. In a case where the droplet lands on the hydrophilic line 6, sandwiched by the hydrophobic regions 7 on the both sides, which has the monospaced line width L, it is supposed that the contact angle is Cassie's contact angle:

$$\theta_c (\theta_1 > \theta_x > \theta_2).$$

Further, where γ is the surface energy of the droplet 8, the following equation approximately represents an amount of energy ΔW consumed with such a change of the shape of the droplet 8 that a radius of the droplet 8 is reduced by x while it stretches along the hydrophilic line 6:

$$\Delta W = 2D\gamma(\cos\theta_2 - \cos\theta_1)x.$$

Where ΔS a surface area increased by the change in the shape, the surface energy γΔS which increases as the shape changes is approximately:

$$\gamma\Delta S = \gamma(D-L)Dx/L.$$

Accordingly, a total energy change ΔE which is the sum of the foregoing two equations is expressed as:

$$\Delta E = \gamma\{D-L-2L(\cos\theta_2 - \cos\theta_1)\}Dx/L.$$

At this point, where:

$$D-L-2L(\cos\theta_2 - \cos\theta_1) > 0,$$

that is:

$$L < D/\{1+2(\cos\theta_2 - \cos\theta_1)\},$$

the shape will not change, because the increase in the ΔE is monotonous whereas the change in the shape of the droplet 8 is not.

On the contrary, where:

$$D-L-2L(\cos\theta_2 - \cos\theta_1) < 0,$$

that is:

$$L > D/\{1+2(\cos\theta_2 - \cos\theta_1)\},$$

the shape will keep changing, because a decrease in the ΔE is monotonous whereas the change in the shape of the droplet 8 is not.

For example, where the second contact angle $\theta_2$ is 0°, and the first contact angle $\theta_1$ is 90°, the calculation will result in D<3L. In this case, the wiring pattern is properly formed with the droplet having the diameter of up to a triple of the width of the hydrophilic line. In other words, it is possible to form the wiring pattern whose width is ⅓ of the droplet diameter.

For example, where the second contact angle $\theta_2$ is 0°, and the first contact angle $\theta_1$ is 180°, the calculation will result in D<5L. In this case, the wiring pattern is properly formed with the droplet having the diameter of up to a quintuple of the width of the hydrophilic line. In other words, it is possible to form the wiring pattern whose width is ⅕ of the droplet diameter.

From the equation (3), derived is an equation: $L > D/\{1+2(\cos\theta_2 - \cos\theta_1)\}$. With this equation, it becomes obvious that a droplet will move along the hydrophilic line 6, in a case where the width L of the hydrophilic line 6 is wider than $D/\{1+2(\cos\theta_2 - \cos\theta_1)\}$. On the other hand, a droplet will not move along the hydrophilic line 6, in a case where the width L of the hydrophilic line 6 is narrower than $D/\{1+2(\cos\theta_2 - \cos\theta_1)\}$.

Accordingly, by adjusting the widths $L_1$ and $L_2$, which are widths of the hydrophilic line 6 toward front and rear sides of the droplet landed thereon, as in the case with the equation (1), the droplet landed will move towards the line width $L_1$ whose width is wider than $D/\{1+2(\cos\theta_2 - \cos\theta_1)\}$, and will not move towards the line width $L_2$ whose line width is narrower than $D/\{1+2(\cos\theta_2 - \cos\theta_1)\}$. In short, it is possible to move the droplet only in one direction.

Figure 5:
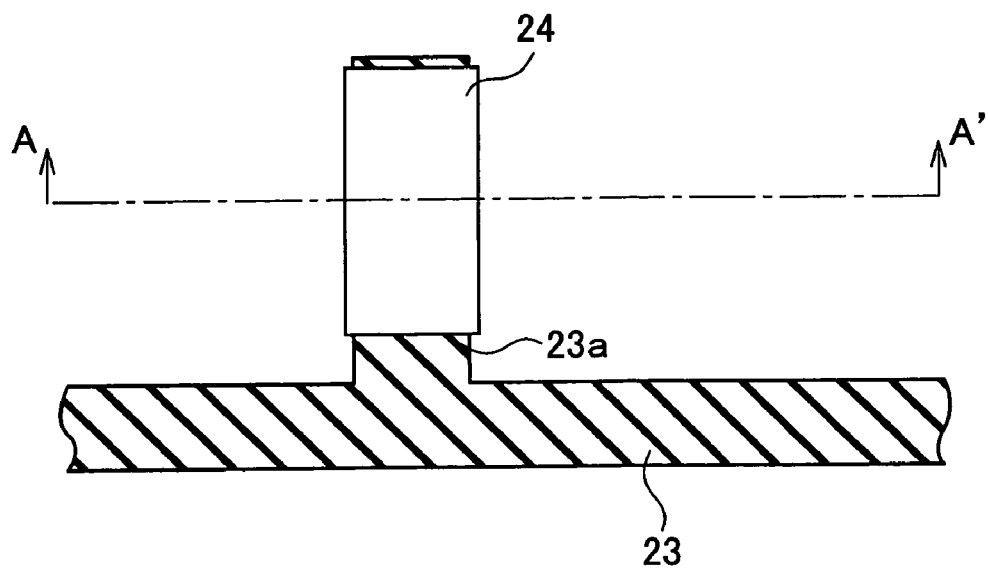
FIGS. 5($a$) and 5($b$) show a step of TFT production using the pattern formation substrate shown in FIG. 1.
Figure 5:
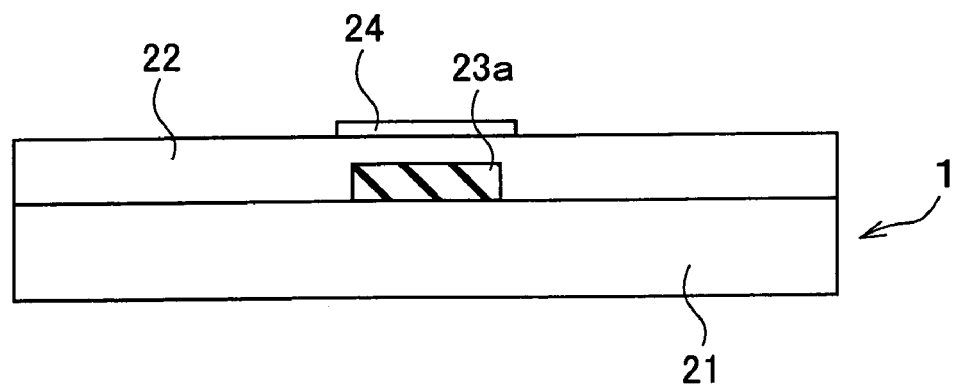
Figure 10:
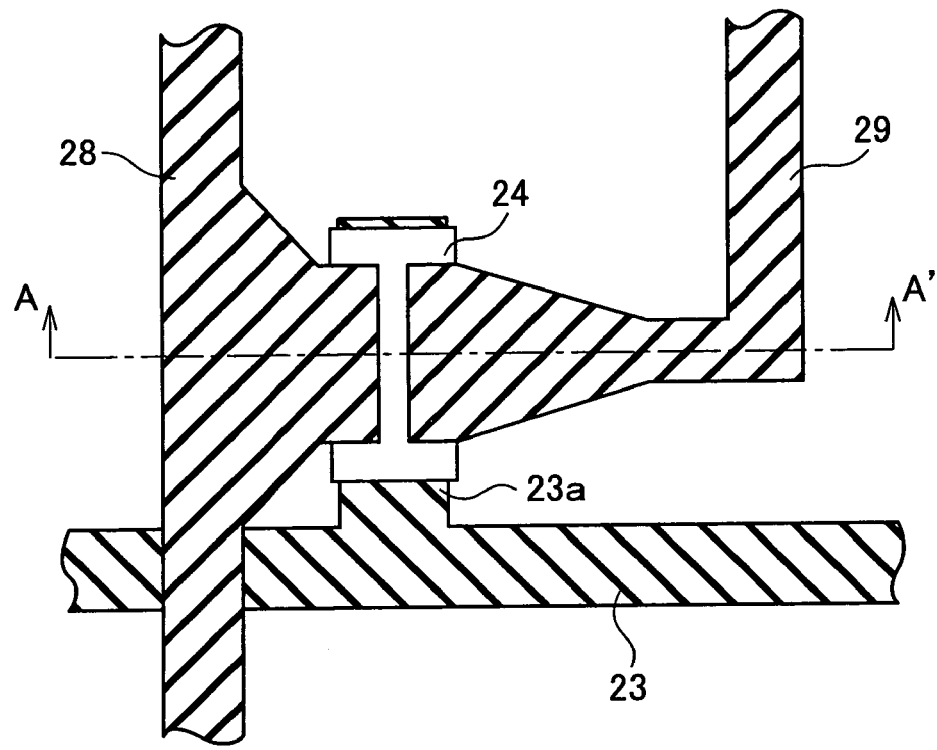
FIGS. 10($a$) and 10($b$) show a step of TFT production using the pattern formation substrate shown in FIG. 1.
Figure 10:
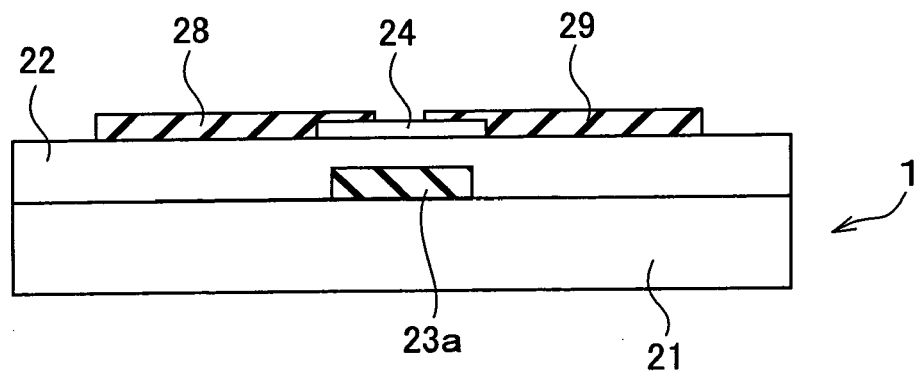

The following describes a pattern formation method using the pattern formation substrate of the foregoing arrangement with reference to FIGS. 5(*a*) and 5(*b*) through FIGS. 10(*a*) and 10(*b*).

As shown in FIGS. 5(*a*) and 5(*b*), a substrate 1 having a glass substrate 21 in which a gate wiring pattern 23, a gate insulator 22, and a-Si/n$^+$ semiconductor layer 24 are formed.

Figure 4:
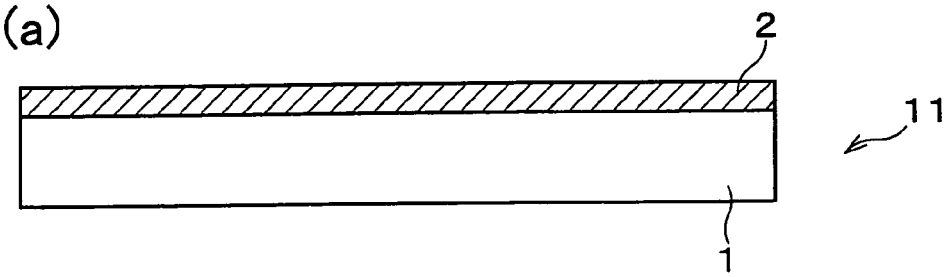
FIGS. 4($a$) through 4($d$) are diagrams showing the steps of forming a hydrophilic region and a hydrophobic region on a substrate.
Figure 4:
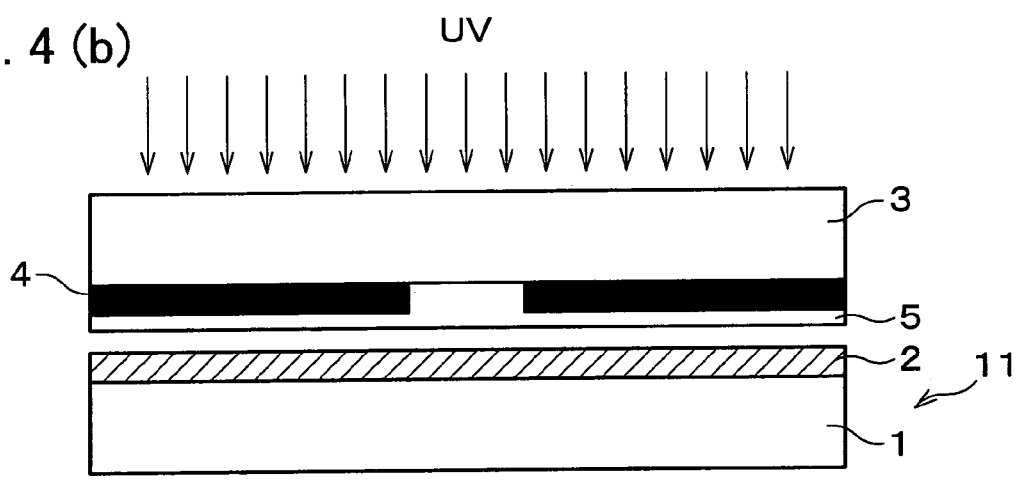
Figure 4:
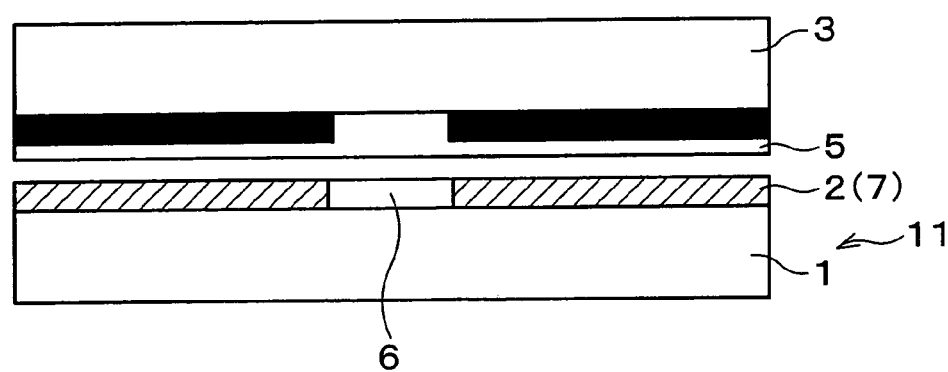
Figure 4:
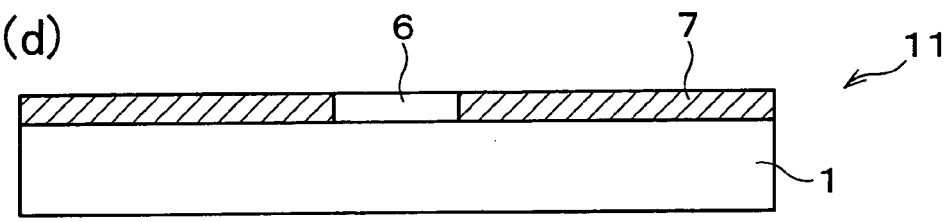

The following describes, with reference to FIG. 4(*a*) through FIG. 4(*d*), a treatment for forming, on the substrate 1, the hydrophilic line 6 and the hydrophobic region 7 (hydrophilic-and-hydrophobic pattern), corresponding to a shape of the source and drain wiring patterns.

First, a wettability-modifiable layer 2 is formed on the substrate 1 by applying and drying silane coupling agent or the like, through a method such as spin coat method (See FIG. 4(*a*)). In the present embodiment, adopted is ZONYL FSN (produced by DuPont corp.), which is a nonionic fluorochemical surfactant, being mixed in isopropyle alcohol.

Figure 6:
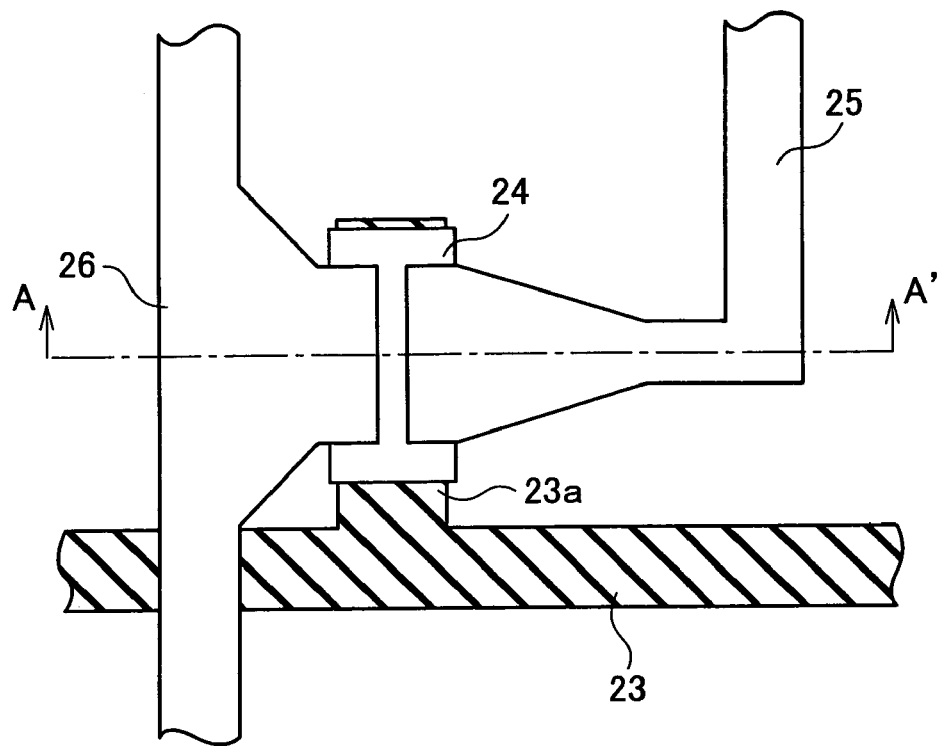
FIGS. 6($a$) and 6($b$) show a step of TFT production using the pattern formation substrate shown in FIG. 1.
Figure 6:
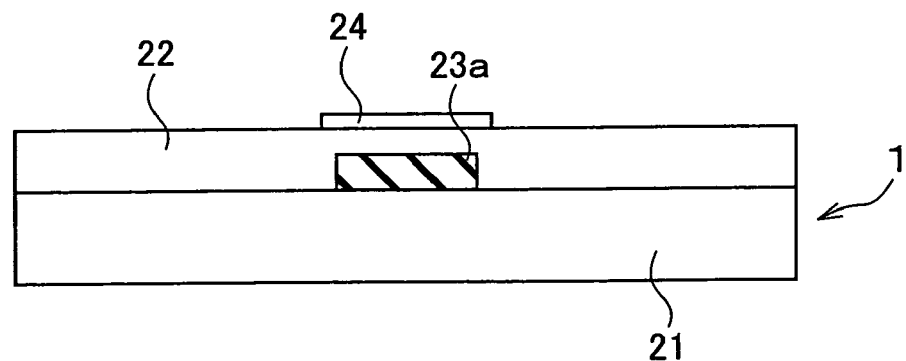

Then, an ultraviolet exposure is carried out through (I) a mask pattern 4 made of chrome or the like, which has been previously formed, and (II) a photomask 3 having a photocatalyst layer 5 of titanium oxide or the like (Refer to FIG. 4(b)). In the present embodiment, the photocatalyst layer 5 is formed by (A) carrying out the spin coat method for applying a mixture of ethanol and titanium dioxide fine particle dispersion element, and (B) carrying out, after the spin coat method, a thermal treatment at 150° C. The exposure was carried out for two minutes under an illumination intensity of 70 mW/cm$^2$, by using a mercury lamp (wavelength band of 365 nm). This causes an improvement of the wettability only in a portion being exposed to the ultraviolet ray (See FIGS. 4(c) and 4(d)), thereby forming a hydrophilic pattern. Here, as shown in FIGS. 6(a) and 6(b), a source region 25 and a drain region 26 of the hydrophilic line are formed. A pattern widths of the narrowest portion in the source region 25 and the drain region 26 are 20 μm.

Figure 7:
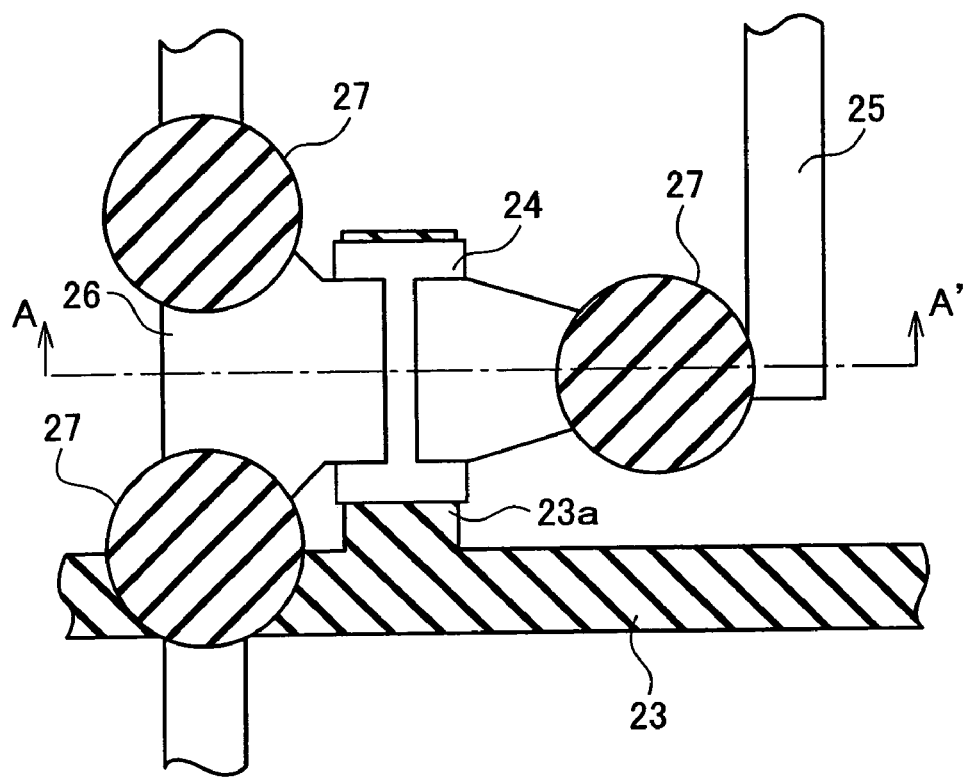
FIGS. 7($a$) and 7($b$) show a step of TFT production using the pattern formation substrate shown in FIG. 1.
Figure 7:
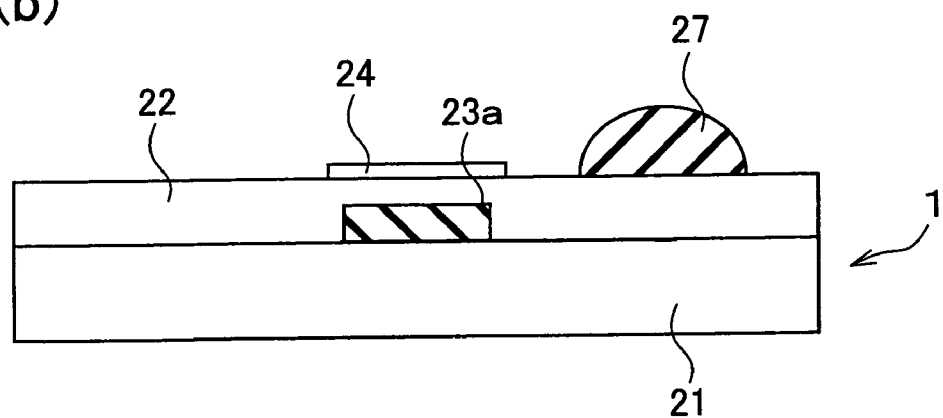

Next, as shown in FIGS. 7(a) and 7(b), the inkjet method is carried out for forming a source and a drain wiring on the substrate 1 on which the hydrophilic-and-hydrophobic pattern is formed, by dropping droplets 27 containing the wiring material.

The droplet 8, which is the wiring material, is a mixed solvent of ethanol and diethylene glycol containing Ag fine particles, and viscosity thereof is adjusted in advance to about 10 cP. In the present embodiment, the first contact angle θ1 of the droplet with respect to the hydrophobic region 7 is 80° and the second contact angle θ$_2$ of the droplet with respect to the hydrophilic line 6 is 10°.

Then, on the substrate 1 on which the hydrophilic-and-hydrophobic pattern is formed, the ejected droplet 27, which is the wiring material, having a diameter of 75 μm, is dropped by using the pattern formation apparatus (See FIGS. 7(a) and 7(b)). The landing position of the droplet 27 is the narrowest portion of the pattern where the pattern width starts to increase therefrom (See FIG. 7(a)). In other words, the landing positions of the droplet 27, in the source region 25 and the drain region 26, respectively have the line widths as shown in FIG. 1(b). Each of the line widths is so adjusted as to satisfy the foregoing equation (1)

Figure 8:
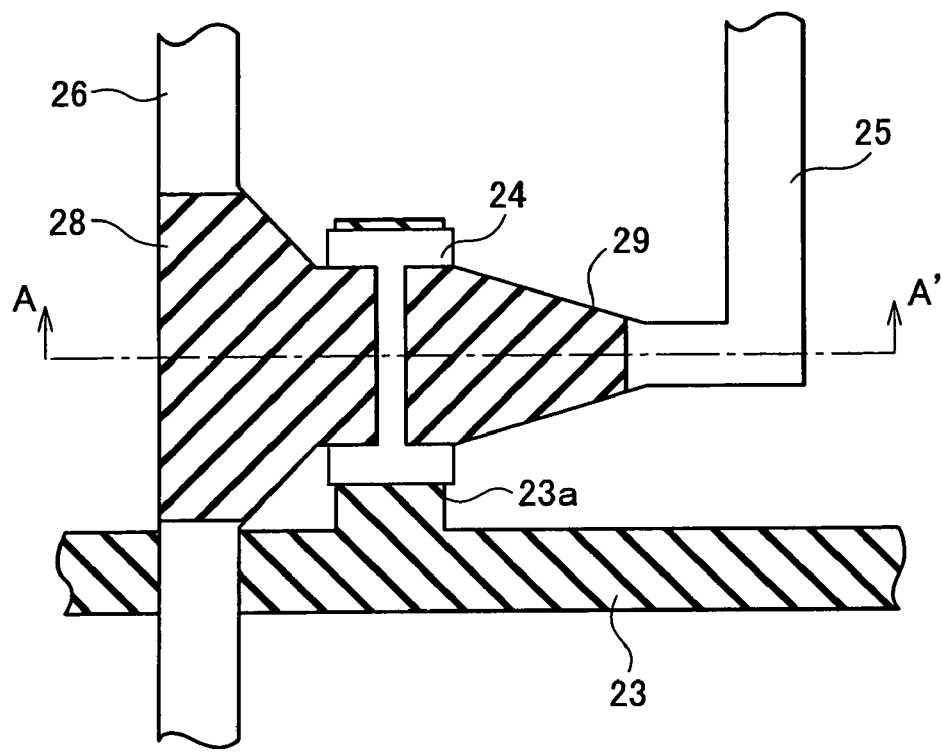
FIGS. 8($a$) and 8($b$) show a step of TFT production using the pattern formation substrate shown in FIG. 1.
Figure 8:
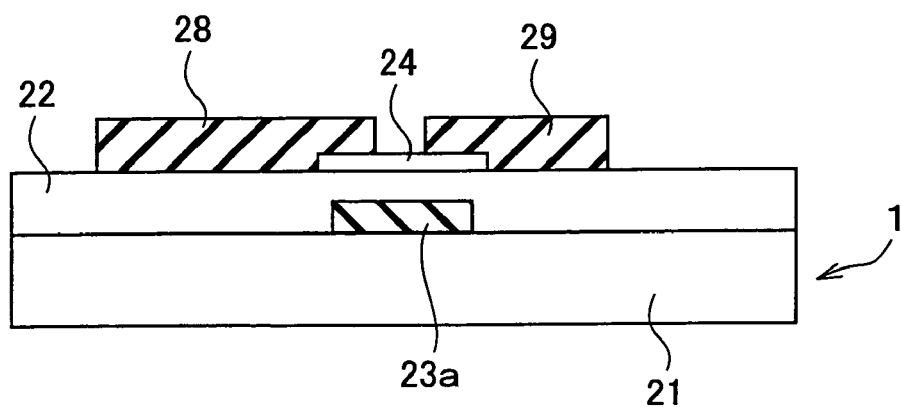

When the droplet 27 of the foregoing size lands on these portions of the pattern, the droplet 27 flows and disperses in a direction of the pattern being expanded. Thus, as shown in FIGS. 8(a) and 8(b), source wiring 29 is formed in a part of the source region 25, and drain wiring 28 is formed in a part of the drain region 26. At this point, the droplet 27 does not disperse in the direction towards the narrowest portion of the pattern. By dropping the droplets 27 in this way, the droplets 27 can be quantitatively dropped without being dropped in the vicinity of the TFT channels (the vicinity of the semiconductor layer 24). This keeps metallic material contained in the droplets 27 from being scattered, thus preventing deterioration in the yield caused by an adhesion of the metallic material.

Figure 9:
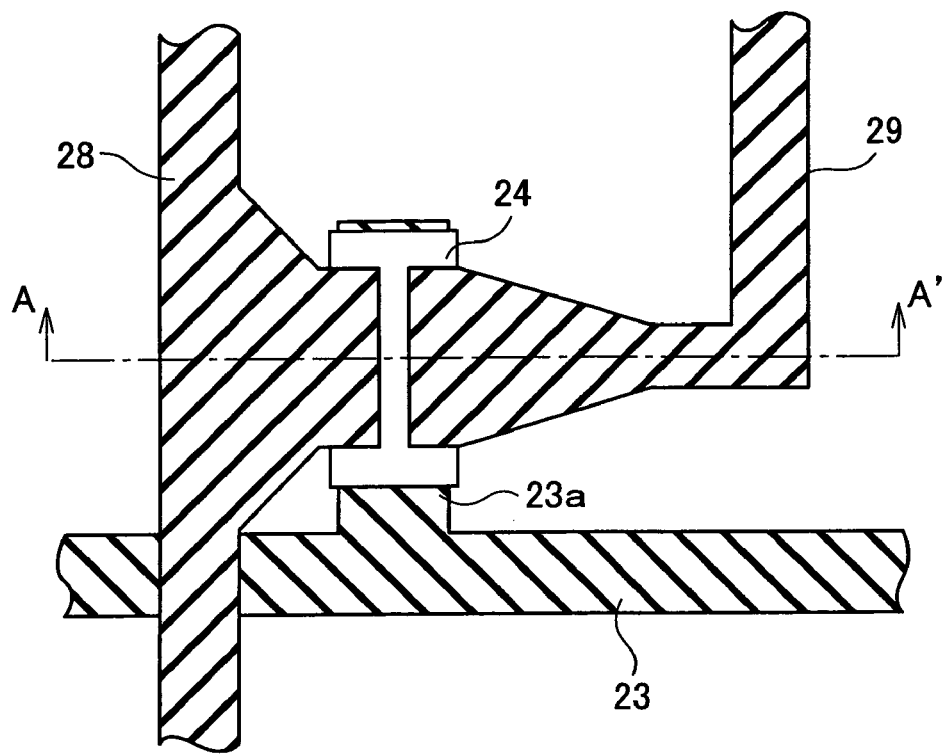
FIGS. 9($a$) and 9($b$) show a step of TFT production using the pattern formation substrate shown in FIG. 1.
Figure 9:
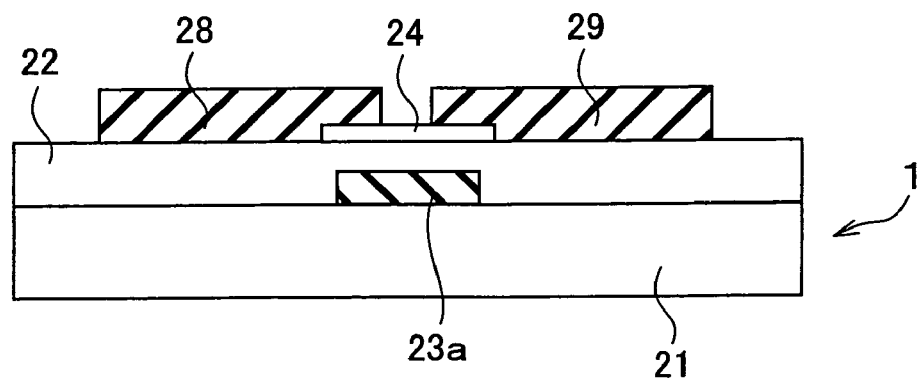

Then, as shown in FIGS. 9(a) and 9(b), the entire targeted regions of the source region 25 and the drain region 26 are filled by (I) adjusting the diameter of the droplet 27 to 50 μm, and (II) dropping the droplet on the narrowest portions of the source region 25 and the drain region 26.

Next, the substrate 1 whose source region 25 and the drain region 26 are filled with the wiring material is dried and calcinated at 200° C. to form the source wiring and the drain wiring as shown in FIGS. 10(a) and 10 (b).

As described above, a continuous pattern (the source wiring and the drain wiring) is formed by connecting the droplets, separately adhering to the source region 25 and the drain region 26, to each other. Thus, a number of ejected droplets is minimized, thereby enabling a reduction of the tact time and more durable droplet ejection structure.

Figure 11:
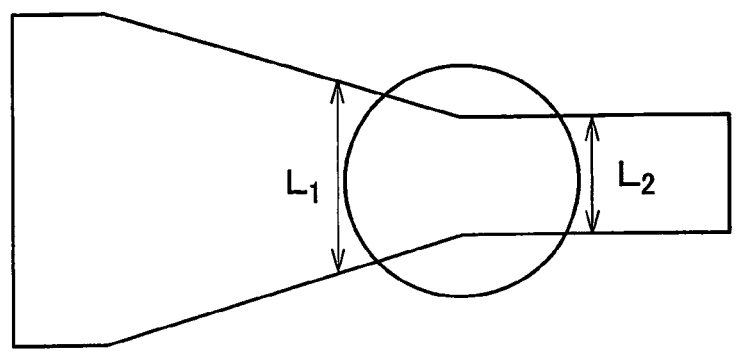
FIGS. 11($a$) through 11($d$) are diagrams showing an exemplary shape of a second region formed on the pattern formation substrate.
Figure 11:
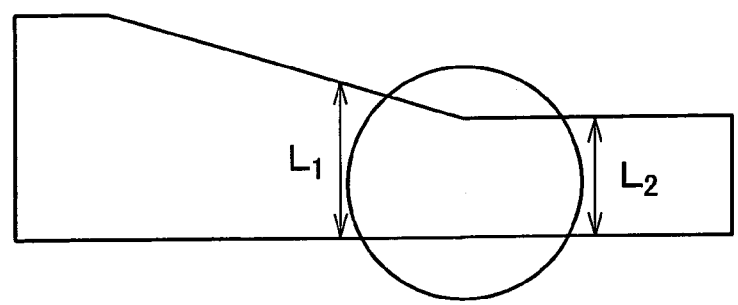
Figure 11:
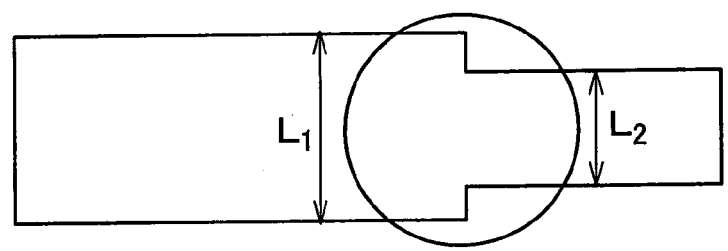
Figure 11:
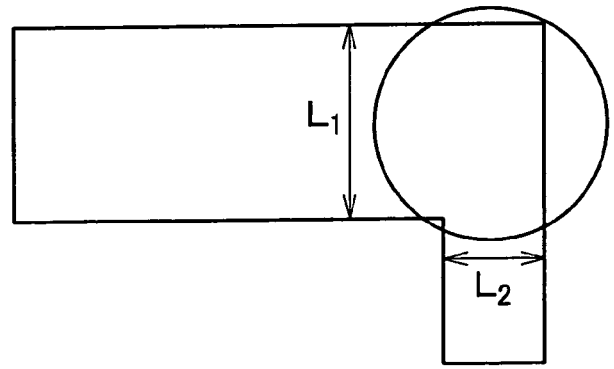

In the present embodiment, the pattern of the hydrophilic line 6 on which droplets are dropped has such a shape that line width (pattern width) is continuously changed (See FIGS. 11(a) and 11(b)). Thus, where the line widths at the both sides of the droplet landed are respectively $L_1$ and $L_2$, $L_1$ is 35 μm and $L_2$ is 0.20 μm. In this case, a relation between (i) a dispersion and (ii) the droplet diameter and the line width is as shown in Table 1 below.

TABLE 1

| drop diameter | line width | | | |
|---|---|---|---|---|
| | 15 μm | 20 μm | 30 μm | 35 μm |
| 50 μm | X | 0 | 0 | 0 |
| 75 μm | X | x | 0 | 0 |

0: disperses
x: does not disperse

Based on Table 1, it is obvious that the direction of the dispersion of the landed droplet can be controlled by optimizing the droplet diameter and the line width.

The present embodiment deals with a case where the pattern width continuously changes as shown in FIGS. 11(a) and 11(b), however the pattern width may also change in a step-manner as shown in FIG. 11(c). Further, the pattern may be a bent-shape as shown in FIG. 11(d). The shapes shown in FIGS. 11(c) and 11(d) both result in similar effects as in the case with FIGS. 11(a) and 11(b).

Figure 12:
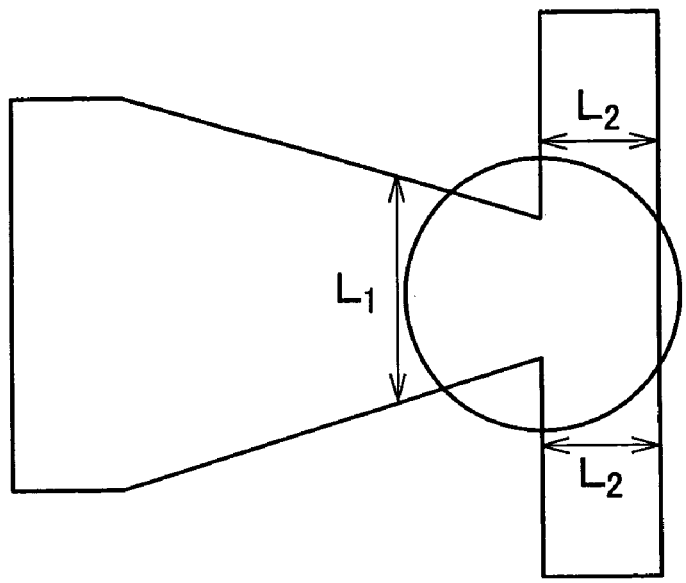
FIG. 12 is a diagram showing another exemplary shape of the second region formed on the pattern formation substrate.

Further, in a case where the pattern branches as shown in FIG. 12, the landed droplet also disperses only in the direction of $L_1$, provided that the line widths $L_1$ and $L_2$ satisfy the foregoing equation (1) (e.g., droplet diameter=75 μm, $L_1$=35 μm, $L_{2=20}$ μm).

Figure 13:
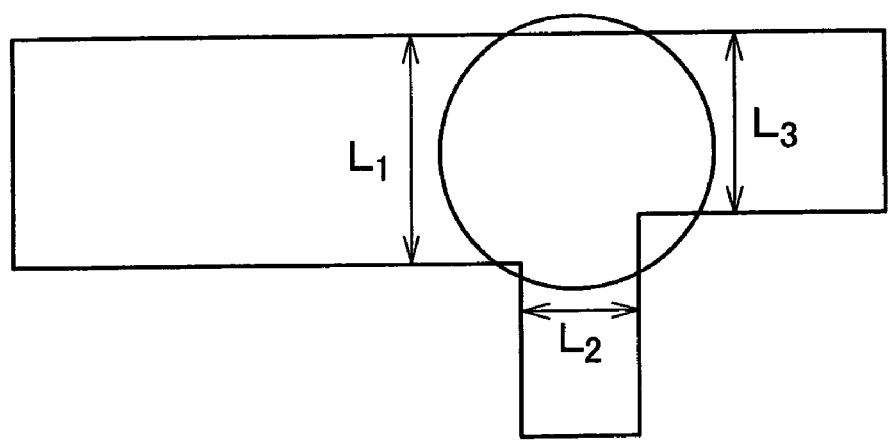
FIG. 13 is a diagram showing yet another exemplary shape of the second region formed on the pattern formation substrate.

Further, as shown in FIG. 13, in a case where the pattern branches, and the line width are all different from one another, the droplet disperses only in the direction where two of line widths $L_1$, $L_2$, and $L_3$ satisfies the foregoing equation (1) (e.g., the droplet will disperse only in the direction of $L_1$ when the droplet diameter=75, $L_1$=35 μm, $L_2$=15 μm, $L_3$=20 μm; The droplet will disperse in the directions of $L_1$ and $L_3$ when droplet diameter=75 μm, $L_1$=35 μm, $L_2$=15 μm, $L_3$=30 μm).

As described above, (a) the first region (hydrophobic region 7) where an angle at which the droplet contacts the pattern formation surface of the substrate 11 is the first angle and (b) the second region (hydrophilic line 6) positioned adjacent to the hydrophobic region 7 so as to have the second contact angle smaller than the first contact angle are formed on the pattern formation surface, and such a surface treatment that the droplet 8 moves in a predetermined direction upon landing on the hydrophilic line 6 is carried out, thereby obtaining the following effects.

Since the droplet 8 landed on the hydrophilic line 6 moves towards a predetermined direction, it is possible to target the landing position of the droplet 8 farther than a conventional landing position. Here, the conventional landing position means a position in which the landed droplet 8 can move in all the directions of the hydrophilic line 6.

This is advantageous in a case where there is a droplet-free region in the vicinity of the conventional landing position, because the landing position of the droplet 8 can be targeted far from the droplet-free region. Thus, the droplet 8 is kept from adhering to the droplet-free region.

Accordingly, this solves any problems caused by the adhesion of the droplet to the droplet-free region, such as a case where desirable properties of the wiring pattern (TFT) is not obtained. In short, this improves the yield of wiring pattern with desirable properties.

More specifically, as shown in FIG. 1(b), when (I) the first line width $L_1$ is a width on a side, in the second region, toward which the droplet moves upon landing, and (II) the second line width $L_2$ is a width on a side, in the second region, opposite to the side toward which the droplet moves, and (III) the first contact angle of the droplet on the first region is $\theta_1$, and the second contact angle of the droplet on the second region is $\theta_2$, and (IV) the droplet diameter is D, the first line width $L_1$ and the second line width $L_2$ are so adjusted as to satisfy the following equations (1):

$$L_1 > D/\{1+2(\cos\theta_2 - \cos\theta_1)\}$$

and $$L_2 < D/\{1+2(\cos\theta_2 - \cos\theta_1)\} \quad (1)$$

By so adjusting the first and the second line widths as to satisfy the equations (1), the landed droplet will move in the predetermined direction; that is, from the region of the hydrophilic line 6 having the second line width towards the region on the side having the first line width.

Further, by regulating the line widths of the droplet 8 landing position so that the equation (1) is satisfied, it is possible to successfully form the wiring, despite the droplet 8 landing position being targeted far from the droplet-free region.

Thus, since the droplets do not adhere to the droplet-free region, deterioration in the properties of the wiring pattern being formed is prevented. This improves the yield of the wiring pattern.

Embodiment 2

Figure 14:
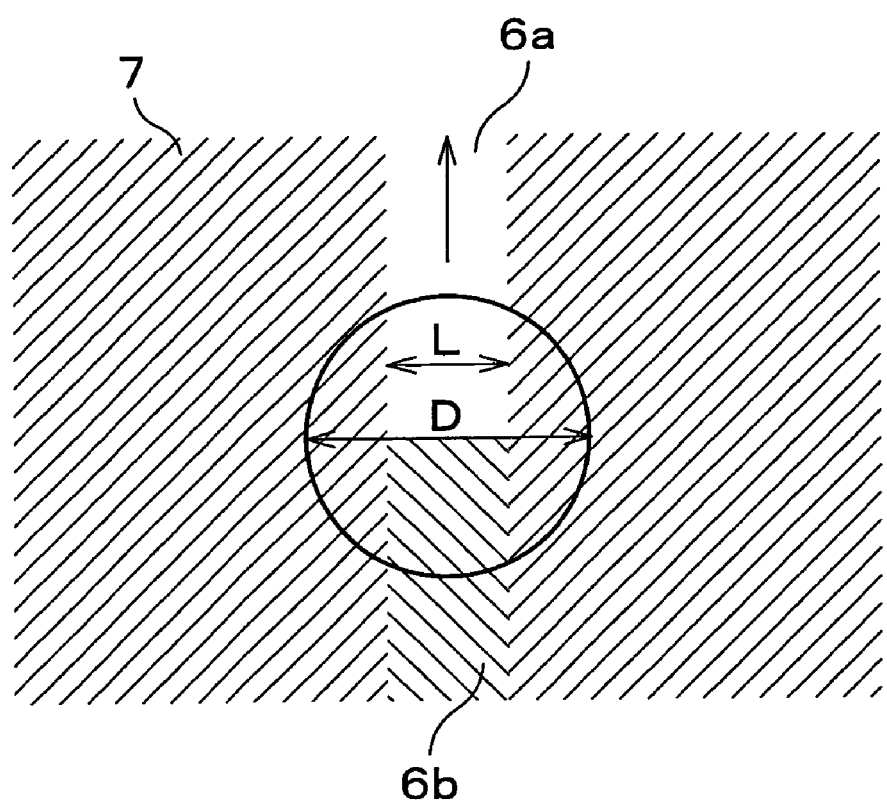
FIG. 14 is a plane view showing another pattern formation substrate in accordance with the present invention

In the present embodiment, as shown in FIG. 14, a side of a pattern formation surface of a pattern formation substrate includes (I) a hydrophobic region 7 (first region) in which a contact angle with respect to a droplet is a first contact angle, (II) a hydrophilic line 6a (second region) in which the contact angle with respect to the droplet is a second contact angle, (III) and a hydrophilic line 6b (third region) in which contact angle with respect to the droplet, i.e., a third contact angle, is larger than the second contact angle.

Here, it is assumed that: the first contact angle $\theta_1$ > the third contact angle $\theta_3$ > the second contact angle $\theta_2$. In other words, the second region, whose second contact angle is $\theta_2$, has a highest wettability with respect to a droplet.

Further, as shown in FIG. 14, a line width of each of the hydrophilic line 6a and the hydrophilic line 6b is L, and a diameter of the droplet being dropped is D.

Further, it is possible to control a direction in which the droplet moves by so adjusting each of the contact angles that the following equation (2) is satisfied.

$$L\times\{1+2(\cos\theta_3-\cos\theta_1)\} \leq D \leq L\times\{1+2(\cos\theta_2-\cos\theta_1)\} \quad (2)$$

The right side of the equation (2) is the same as the equation (3) described in the foregoing embodiment 1; that is: $D<L\{1+2(\cos\theta_2-\cos\theta_1)\}$ (3), and defines the movement of the droplet on the hydrophobic region 7 and the hydrophilic line 6a. Accordingly, by so adjusting the second contact angle and the first contact angle that the right side is satisfied, the droplet disperses only in the direction of the hydrophilic line 6a.

Further, the left side of the equation (2) defines the movement of the droplet on the hydrophobic region 7 and the hydrophilic line 6b. Accordingly, by so adjusting the third contact angle and the second contact angle that the left side is satisfied, the droplet does not disperse toward the hydrophilic line 6b. However, the droplet will disperse when a relationship between the hydrophobic region 7 and the hydrophilic line 6b satisfies the right side of the equation (2).

Thus, by adjusting each of the contact angles so that the equation (2) is satisfied, the droplet landed on the pattern formation substrate disperses only in the hydrophilic line 6a. Therefore, the width of the hydrophilic line 6 does not have to be changed as in the case with the foregoing embodiment 1. However, it is necessary that the droplet 8 land in such a position that the center of the droplet is positioned on the border between the hydrophilic line 6a and the hydrophilic line 6b.

The following describes a method for forming source and drain wiring patterns of a TFT liquid crystal display panel by using the foregoing pattern formation substrate.

Figure 15:
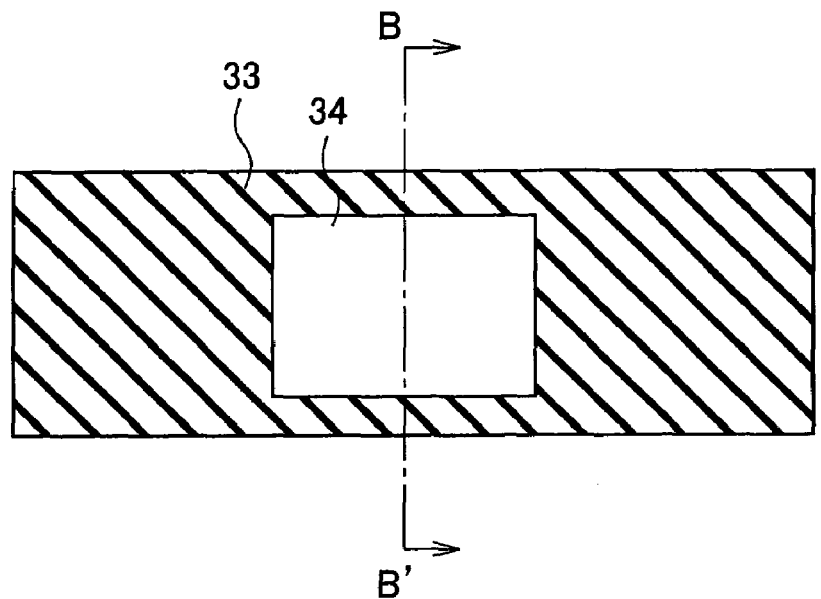
FIGS. 15(a) and 15(b) show a step of TFT production using the pattern formation substrate shown in FIG. 14.
Figure 15:
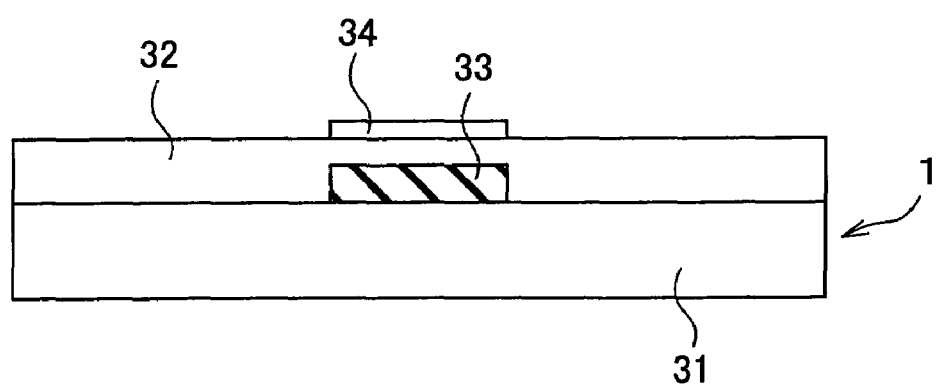

As shown in FIGS. 15(a) and 15(b), a substrate 1 having a glass substrate 31 in which a gate wiring pattern 33, a gate insulator 32, and an a-Si/n$^+$ semiconductor layer 34 are formed is used.

Figure 16:
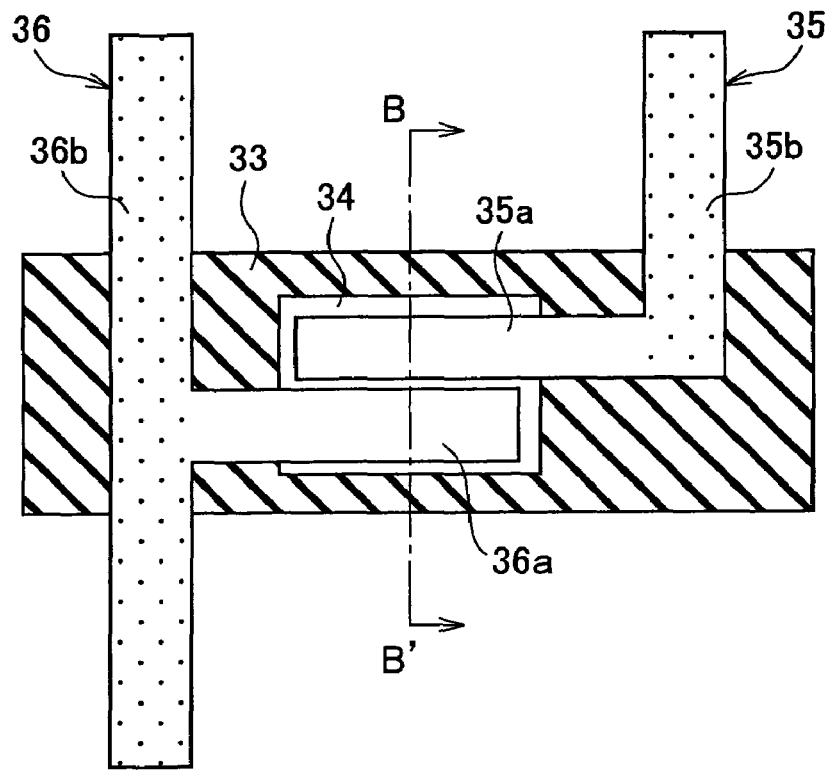
FIGS. 16(a) and 16(b) show a step of TFT production using the pattern formation substrate shown in FIG. 14.
Figure 16:
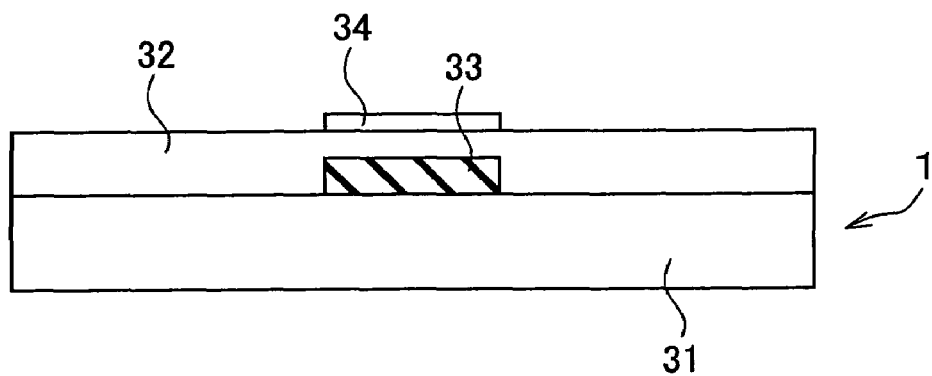

First, a hydrophilic-and-hydrophobic pattern, which is the source and drain wiring, is formed on the substrate 1 as shown in FIGS. 15(a) and 15(b) by carrying out the method similar to the embodiment 1. As for exposure conditions, a region far from the TFT (first region) is exposed for one minute by using a mercury lamp (wavelength band of 365 nm) at an illumination intensity of 70 mW/cm$^2$, and the region in the vicinity of the TFT (second region) is exposed for two minutes. Here, as shown in FIGS. 16(a) and 16(b), the hydrophilic pattern of the source region 35 and the drain region 36 are formed. Each of pattern widths of the regions is 35 μm and constant.

It should be noted that the source region 35 includes a first source region 35a having a high wettability, and a second source region 35b having a lower wettability than that of the first source region 35a. Further, the drain region 36 includes a first drain region 36a having a high wettability, and a second drain region 36b having a lower wettability than that of the first drain region 36a. The wettability of the first source region 35a equals to that of the first drain region 36a, and the wettability of the second region 35b equals to that of the second drain region 36b.

Figure 17:
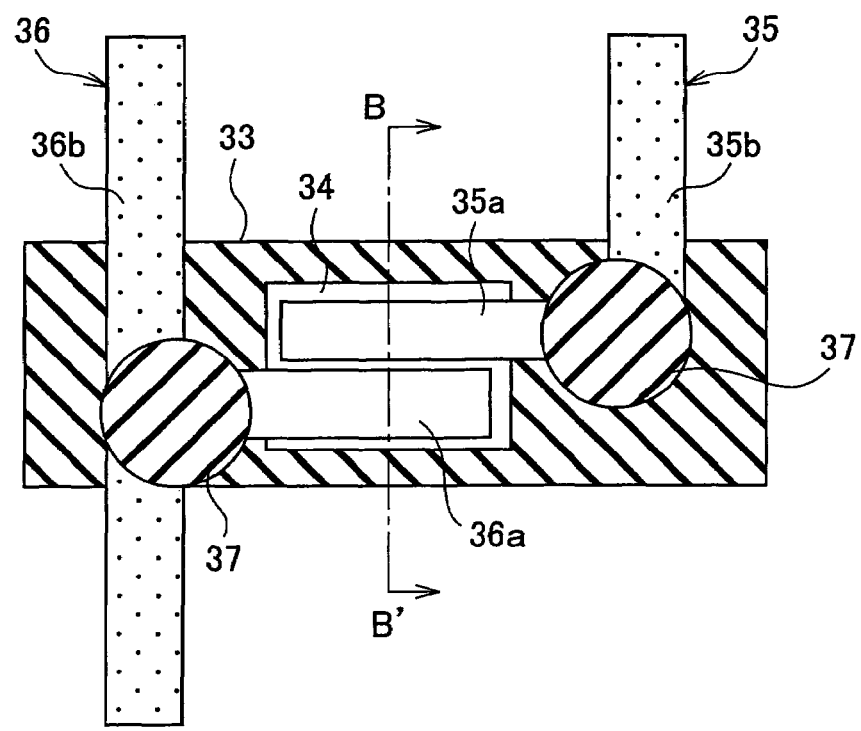
FIGS. 17(a) and 17(b) show a step of TFT production using the pattern formation substrate shown in FIG. 14.
Figure 17:
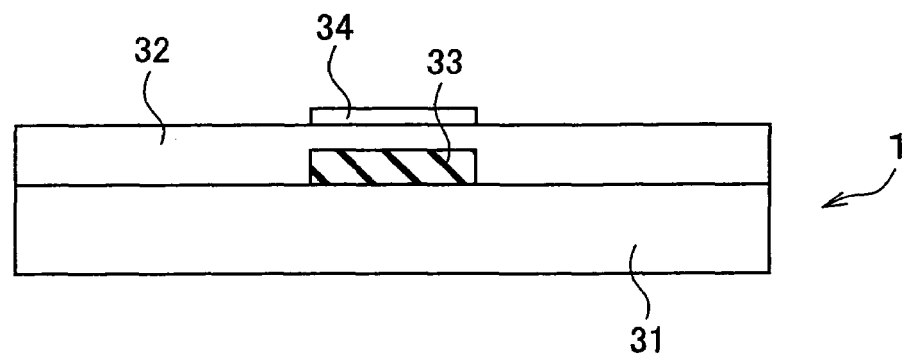

Next, as shown in FIGS. 17(a) and 17(b), the source and drain wiring is formed by carrying out an inkjet method for dropping droplets 37 (wiring material) onto the substrate 1 on which the hydrophilic-and-hydrophobic pattern is formed. The droplet, an inkjet head, and the apparatus used here are the same as those used in the embodiment 1.

Here, (I) the first contact angle is 80°, in a case where the droplets 37 are dropped on the hydrophobic region, (II) a third contact angle is 45°, in a case where the droplets 37 are dropped on the hydrophilic pattern (second exposure region) including the second source region 35b and the second drain region 36b, and (III) a second contact angle is 10°, in a case where the droplets 37 are dropped on the hydrophilic pattern (first exposure region) including the first source region 35a and the first drain region 36a.

As shown in FIGS. 17(a) and 17(b), the droplets 37 each of which has a diameter of 75 μm are dropped, by using the inkjet apparatus, onto the substrate 1 on which the hydrophilic-and-hydrophobic pattern is formed. As shown in FIGS. 17(a) and 17(b), the landing positions of the respective droplets 37 are in the vicinity of the border between the first and second exposure regions.

In other words, the source region 35 and the drain region 36 in the landing positions of the droplets 37 respectively result in the wettability (the relationship between contact angles of the droplets 37) shown in FIG. 14. Each of the contact angles is so adjusted as to satisfy the foregoing equation (2).

Figure 18:
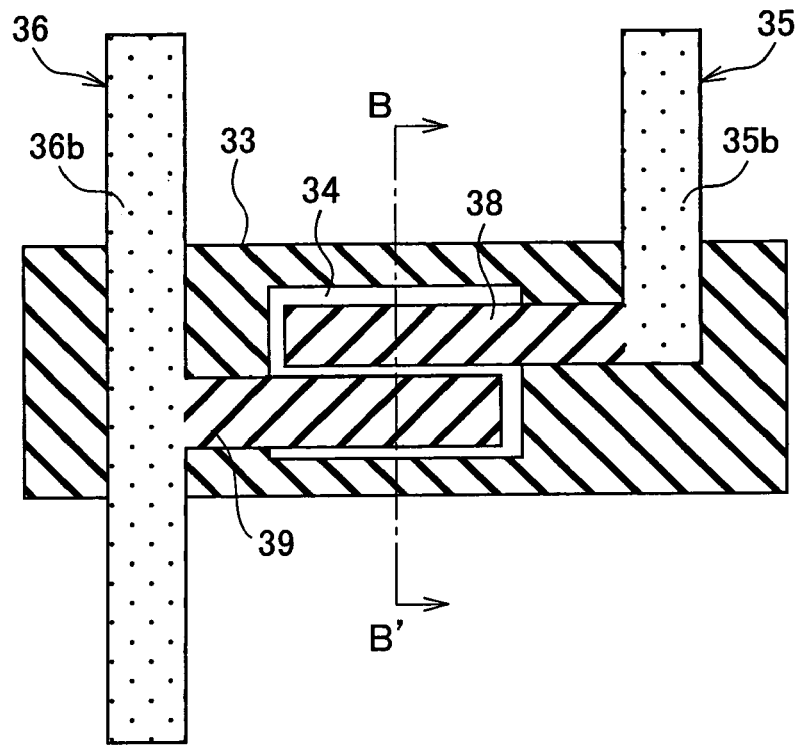
FIGS. 18(a) and 18(b) show a step of TFT production using the pattern formation substrate shown in FIG. 14.
Figure 18:
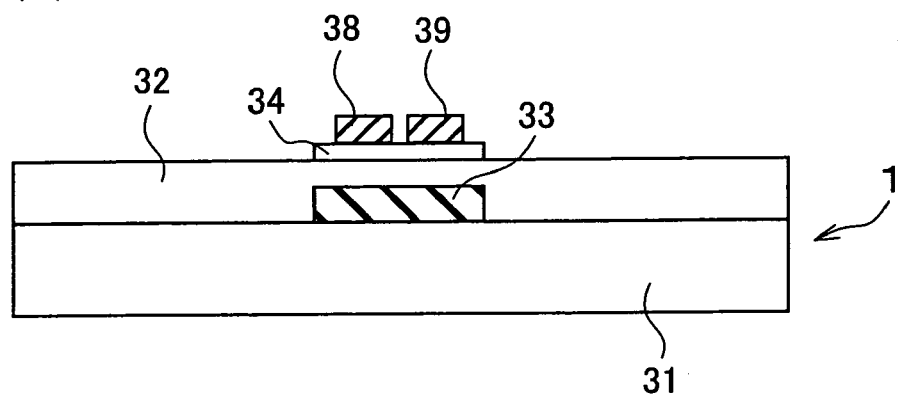

In a case where the droplets each of which has this size are dropped on these portions, the droplets 37 flow and disperse in a direction of the first exposure region; i.e. the first source region 35a and the first drain region 36a (See FIGS. 18(a) and 18(b)), but not in a direction of the second exposure region; i.e. the second source region 35b and the second drain region 36b. This forms a source wiring 38 and a drain wiring 39. By dropping the wiring material as described, the wiring material is quantitatively dropped without being dropped in the vicinity of the TFT channels. This prevents deterioration in the yield caused by metallic material being scattered and adhering to a channel section.

Figure 19:
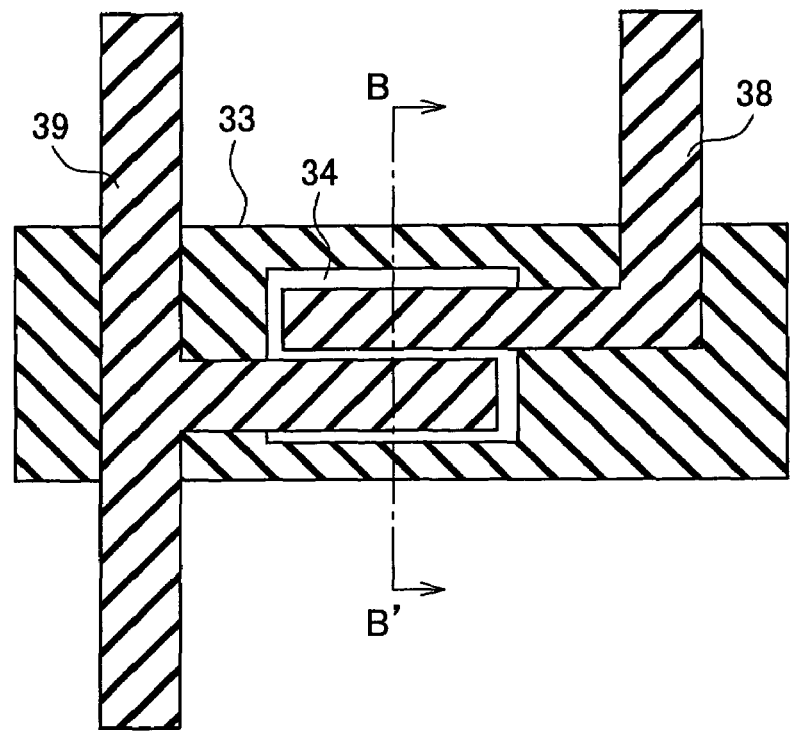
FIGS. 19(a) and 19(b) show a step of TFT production using the pattern formation substrate shown in FIG. 14.
Figure 19:
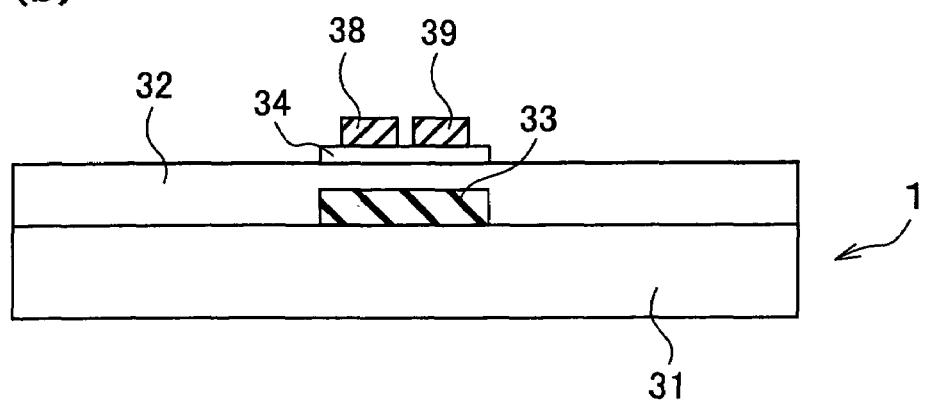

Then, as shown in FIGS. 19(a) and 19(b), the entire targeted regions of the source wiring 38 and the drain wiring 39 are filled with liquid material by (I) adjusting the diameter of the droplet to 50 μm, and (II) dropping the droplet on the narrowest portions.

Finally, the source and drain wiring is completed by drying and calcinating the substrate 1 on which the wiring material is dropped.

In a case where the line width is 35 μm, the dispersion of the droplets resulted as shown in Table 2 below.

TABLE 2

| drop diameter | contact angle | | | |
|---|---|---|---|---|
| | 10° | 30° | 45° | 60° |
| 50 μm | O | O | O | O |
| 75 μm | O | O | x | x |

O: disperses
x: does not disperse

The present embodiment deals with a case where the pattern width is constant, and the contact angles on the both ends of the landed droplet are different from each other.

However, the similar effects are obtained by changing the pattern width. Further, the shape of the pattern may be straight or a bent-shape. Further, the similar effects are also obtained even in a case where the shape of the pattern is in a branched-manner having three branches or more.

The foregoing arrangement also allows the controlling of the direction in which the landed droplet moves. Thus, the similar effects as in the case with the foregoing embodiment 1 are obtained.

Further, on the substrate 11 serving as the pattern formation substrate, regions having various degrees of the wettability (the hydrophobic region 7, the hydrophilic line 6a, the hydrophilic line 6b) are formed. The droplets are landed so as to cover the three-regions.

More specifically, where (I) the contact angle of the droplet with respect to the hydrophobic region 7 is the first contact angle $\theta_1$, (II) the contact angle of the droplet with respect to the hydrophilic line 6a is the second contact angle $\theta_2$, (III) the contact angle of the droplet with respect to the hydrophilic line 6b is the third contact angle $\theta_3$, (IV) the width of each of the hydrophilic lines 6a and 6b is a line width L, and (V) the diameter of the droplet is the diameter D, the contact angles are so adjusted as to satisfy the following equation (2).

$$L \times \{1+2(\cos \theta_3 - \cos \theta_1)\} < D < L \times \{1+2(\cos \theta_2 - \cos \theta)\} \quad (2)$$

In this case, since the contact angles in the respective regions are so adjusted as to satisfy the equation (2), it is possible to cause the droplet landed, overlapping the three regions, to move in a predetermined direction, without changing the line widths of the hydrophilic lines 6a and 6b. For example, in a case where the second contact angle $\theta_2$ is smaller than the third contact angle $\theta_3$, in the hydrophilic lines 6a and 6b, the landed droplet is more likely to move in the side of the hydrophilic line 6b where the contact angle is the second contact angle $\theta_2$ in a side of the hydrophilic line 6b where the contact angle is the third contact angle $\theta_3$. Here, in a case where the third contact angle $\theta_3$ equals to the first contact angle $\theta_1$ in the hydrophobic region 7, the droplet is repelled by the hydrophilic line 6b where the contact angle is the third contact angle $\theta_3$. This causes the droplet to move only in the direction of the hydrophilic line 6a where the contact angle is the second contact angle $\theta_2$.

As described, by defining the line widths of the droplet landing position so that the equation (2) is satisfied, it is possible to successfully form the wiring, despite the droplet landing position being targeted far from the droplet-free region.

Thus, since the droplets do not adhere to the droplet-free region, deterioration in the properties of the wiring pattern being formed is prevented. This improves the yield of the wiring pattern.

It should be noted that, in each of the foregoing embodiments, the liquid wiring material used for forming the wiring is obtained by dispersing Ag fine particles in a mixed solvent of ethanol and diethylene glycol. Therefore, the affinity with liquid is expressed as "hydrophilic", and the repellency to liquid is expressed as "water repellency". However, the solvent for mixing in the wiring material may be an oil base instead of a water base. In such a case, the affinity with liquid may be expressed as "lipophilic" and the repellency to liquid may be expressed as "oil repellency".

Further, each of the foregoing embodiments deal with a case where the inkjet method utilizing an inkjet head is used for ejecting the droplets on the substrate 11 serving as the pattern formation substrate, however the present invention is not limited to this, and it is possible to adopt any mechanisms, such as dispenser system or the like, in which the droplet diameter can be controlled.

Further, the inkjet head is not limited to a piezo-electric type inkjet head, and a thermal type inkjet head such as Bubble Jet (trademark registered) may be adopted.

As described above, a pattern formation substrate of the present invention, on which a surface of the second region is treated so that the droplet moves in a predetermined direction when the droplet is landed, includes (A) a first region where a contact angle at which the droplet contacts the targeted surface is a first contact angle, said first region being formed on the targeted surface; and (B) one or more second regions where the contact angle of the droplet is a second contact angle smaller than the first contact angle, said second region being formed on the targeted surface so as to be positioned adjacent to the first region, in which a surface of the second region is treated so that the droplet moves in a predetermined direction when the droplet is landed.

Thus, since the droplet landed on the second region moves in the predetermined direction, it is possible to target the landing position of the droplet in a position far from a conventional landing position. Here, a conventional landing position means that a position where the droplet landed on the second region can move in all the directions.

This is advantageous in a case where there is a droplet-free region in the vicinity of the conventional landing position, because the landing position of the droplet can be targeted at the position far from the droplet-free region. Thus, the droplet is kept from adhering to the droplet-free region.

Accordingly, this solves any problems caused by the adhesion of the droplet to the droplet-free region, such as a case where desirable properties of the wiring pattern (TFT) is not obtained. In short, this improves the yield of wiring pattern with desirable properties.

Further, it is possible to adapt so that a first line width $L_1$ and a second line width $L_2$ are so adjusted as to satisfy an equation (1) below, $$L_1 > D/\{1+2(\cos\theta_2 - \cos\theta_1)\}$$

and $$L_2 > D/\{1+2(\cos\theta_2 - \cos\theta_1)\} \qquad (1),$$

where:
the first line width $L_1$ is a width on a side, in the second region, toward which the droplet moves upon landing,
the second line width $L_2$ is a width on a side, in the second region, opposite to the side toward which the droplet moves,
$\theta_1$ is the first contact angle of the droplet in the first region,
$\theta_2$ is the second contact angle of the droplet in the second region, and
D is a diameter of the droplet.

By adjusting the first and the second line widths so that the equation (1) is satisfied, it is possible to cause the droplet landed to move in the predetermined direction; i.e., from the side of the second line width in the second region toward the first line width.

By defining the line widths of the droplet landing position so that the equation (1) is satisfied, it is possible to successfully form the wiring, despite the droplet 8 landing position being targeted far from the droplet-free region.

Thus, since the droplets do not adhere to the droplet-free region, deterioration in the properties of the wiring pattern being formed is prevented. This improves the yield of the wiring pattern.

Further, it is possible to adapt so that each of the contact angles is so adjusted as to satisfy an equation (2) below, $$L \times \{1+2(\cos\theta_3 - \cos\theta_1)\} < D < L \times \{1+2(\cos\theta_2 - \cos\theta_1)\} \qquad (2),$$

where:
$\theta_1$ is the first contact angle of the first region with respect to the droplet,
$\theta_2$ is the second contact angle of the second region with respect to one side of the droplet landed,
$\theta_3$ is a third contact angle of the second region with respect to another side of the droplet,
a line width L is a width of the second region, and
D is a diameter of the droplet; and
a position of the droplet being landed is targeted so as to overlap the first region and two of the second regions.

In this case, since the contact angles in the respective regions are so adjusted as to satisfy the equation (2), it is possible to cause the droplet landed, overlapping the three regions, to move in a predetermined direction, without changing the line widths of the hydrophilic lines 6a and 6b. For example, in a case where the second contact angle $\theta_2$ is smaller than the third contact angle $\theta_3$, in the hydrophilic lines 6a and 6b, the landed droplet is more likely to move in the side of the hydrophilic line 6b where the contact angle is the second contact angle $\theta_2$ than in a side of the hydrophilic line 6b where the contact angle is the third contact angle $\theta_3$. Here, in a case where the third contact angle $\theta_3$ equals to the first contact angle $\theta_1$ in the hydrophobic region 7, the droplet is repelled by the hydrophilic line 6b where the contact angle is the third contact angle $\theta_3$. This causes the droplet to move only in the direction on the side of the region where the contact angle is the second contact angle $\theta_2$.

By defining the line widths of the droplet landing position so that the equation (1) is satisfied, it is possible to successfully form the wiring, despite the droplet 8 landing position being targeted far from the droplet-free region.

Thus, since the droplets do not adhere to the droplet-free region, deterioration in the properties of the wiring pattern being formed is prevented. This improves the yield of the wiring pattern.

As described above, in the pattern formation method of the present invention, the droplets are ejected to the pattern formation substrate.

Since it is possible to control the direction in which the droplet landed on the pattern formation substrate moves, the droplet landing position can be targeted at the position far from the droplet-free region.

Accordingly, this solves any problems caused by the adhesion of the droplet to the droplet-free region, such as deterioration in the yield of the wiring pattern.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

A pattern formation method and a pattern formation substrate of the present invention are suitably adopted to a field of forming a wiring pattern of a circuit board by using an inkjet technology, and particularly to a field requiring an improvement in the yield of the circuit board, an improvement in duration of an inkjet head, and reduction of production costs.

The invention claimed is:

1. A pattern formation substrate on which a predetermined pattern is formed by ejecting a droplet to a targeted surface, said pattern formation substrate comprising:
   a first region on the targeted surface; and
   a second region on the targeted surface, the second region being adjacent to the first region;
   the first region having a hydrophilicity that is less than that of the second region;
   the second region having at least two different widths, a first line width $L_1$ and a second line width $L_2$, which widths are adjusted to satisfy conditions (1) and (2), $$L_1 > D/[1+2(\cos\theta_2 - \cos\theta_1)] \qquad (1)$$

$$L_1 > D/[1+2(\cos\theta_2 - \cos\theta_1)] \qquad (2)$$

where $\theta_1$ is a first contact angle when the droplet contacts the first region, $\theta_2$ is a second contact angle when the droplet contacts the second region, and D is the diameter of the droplet.

2. A method for forming a pattern, the method comprising the steps of:
   preparing a pattern formation substrate as set forth in claim 1; and
   ejecting a droplet to a position overlapping the two different widths in the second region.

3. The method as set forth in claim 2, wherein a continuous pattern is formed by connecting a plurality of droplets adhering to a targeted surface in a scattering-manner.

4. The method as set forth in claim 2, wherein an inkjet head is used for ejecting the droplet.

5. The method as set forth in claim 2, wherein
   the first and the second regions are formed substantially in a flat shape.

6. The method as set forth in claim 2, wherein the droplet contains an electrically conductive particle.

7. The method as set forth in claim 2, further comprising forming a wettability-modifiable layer on the substrate and irradiating the layer to form said first and second regions, wherein portions of the wettability-modifiable layer are not removed.

8. A pattern formation substrate on which a predetermined pattern is formed by ejecting a droplet to a target surface, said pattern formation substrate comprising:
   a first region on the target surface; and
   a second region of width L on the target surface and adjacent to the first region, the second region having at least a first sub-region and a second sub-region, and the first region having a hydrophilicity that is less than that of the second sub-region, and the second sub-region having a hydrophilicity that is less than that of the first sub-region;
   a first contact angle $\theta_1$, when the droplet contacts the first region;
   a second contact angle $\theta_2$, when the droplet contacts the second region;
   and a third contact angle $\theta_3$, when the droplet contacts the second region, wherein the contact angles are adjusted to satisfy the condition, $$L \times [1+2(\cos \theta_3 - \cos \theta_1)] < D < L \times [1+2(\cos \theta_2 \cos \theta_1)] \qquad (3)$$

where D is the diameter of the droplet.

9. A method for forming a pattern, the method comprising the steps of:
   preparing a pattern formation substrate as set forth in claim 8; and
   ejecting a droplet to a position overlapping the first sub-region and the second sub-region.

* * * * *